United States Patent [19]

Katakura et al.

[11] Patent Number: 5,231,345
[45] Date of Patent: Jul. 27, 1993

[54] SEMICONDUCTOR INTEGRATED CIRCUIT DEVICE HAVING A TEST CIRCUIT

[75] Inventors: Hiroshi Katakura; Makoto Yoshida, both of Kawasaki; Masayuki Kokado, Machida, all of Japan

[73] Assignee: Fujitsu Limited, Kawasaki, Japan

[21] Appl. No.: 666,611

[22] Filed: Mar. 8, 1991

[30] Foreign Application Priority Data

Mar. 20, 1990 [JP] Japan .................................. 2-72334

[51] Int. Cl.⁵ .......................................... G01R 31/28
[52] U.S. Cl. ............................... 324/73.1; 324/158 R; 371/22.6
[58] Field of Search .................. 324/73.1, 158 R; 371/22.6, 22.5; 340/825.79, 825.89, 825.9

[56] References Cited

U.S. PATENT DOCUMENTS

3,921,140 11/1975 Houston et al. ................. 340/825.9
4,749,947 6/1988 Gheewala ........................ 324/73 R

FOREIGN PATENT DOCUMENTS

61-42934 3/1986 Japan .

OTHER PUBLICATIONS

D. K. Jadus, et al., "Test Pad Multiplexing", IBM Technical Disclosure Bulletin, vol. 18, No. 7, Dec. 1975, pp. 2181-2182.
J. Cancard, et al., "Voltage Checking Device", IBM Technical Disclosure Bulletin, vol. 8, No. 5, Oct. 1965, pp. 806-807.

Primary Examiner—Ernest F. Karlsen
Attorney, Agent, or Firm—Staas & Halsey

[57] ABSTRACT

A semiconductor integrated circuit device includes an array of a plurality of basic circuits, and a test circuit which tests a logic circuit formed of at least one of the basic circuits. The test circuit includes a plurality of select lines, a plurality of read lines, and a plurality of switching circuits. Each of the switching circuits has a first bipolar transistor having a base coupled to at least one test point of the corresponding basic circuit, a collector and an emitter both connectable to connect the test point to a corresponding one of the read lines when a corresponding one of the switching circuits is turned ON in response to a select signal supplied via a corresponding one of the select lines. The test circuit also includes a select line selecting circuit for selecting one of the select lines and for outputting the select signal to a selected one of the select lines. The select signal turns ON selected first bipolar transistors among the plurality of first bipolar transistors. The selected first bipolar transistors are connected to the selected one of the select lines. The test circuit further includes a test data outputting circuit for detecting a change in a predetermined parameter related to each of the read lines and for outputting, as test data indicating information about the test point, the change to a monitor output terminal.

41 Claims, 23 Drawing Sheets

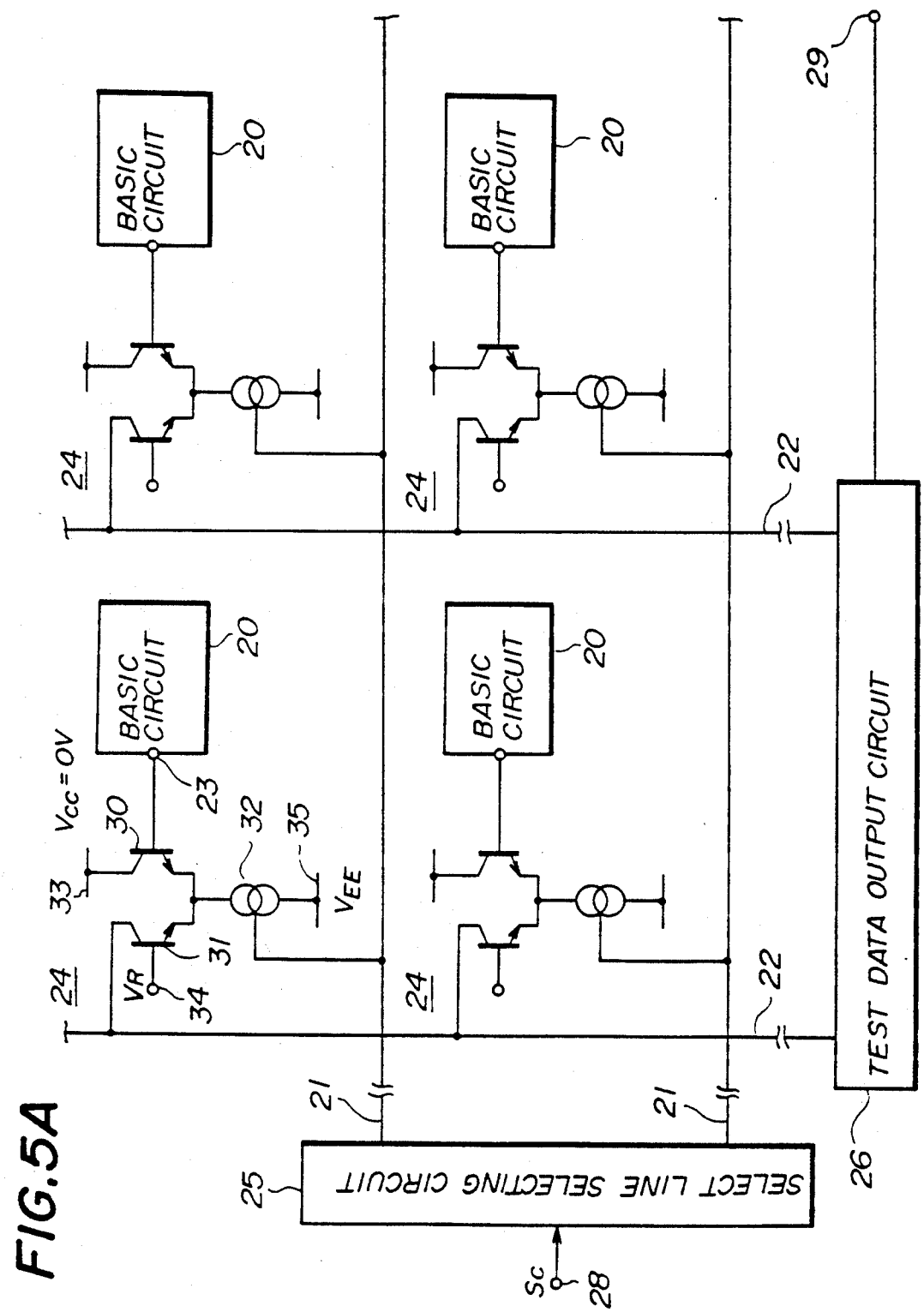

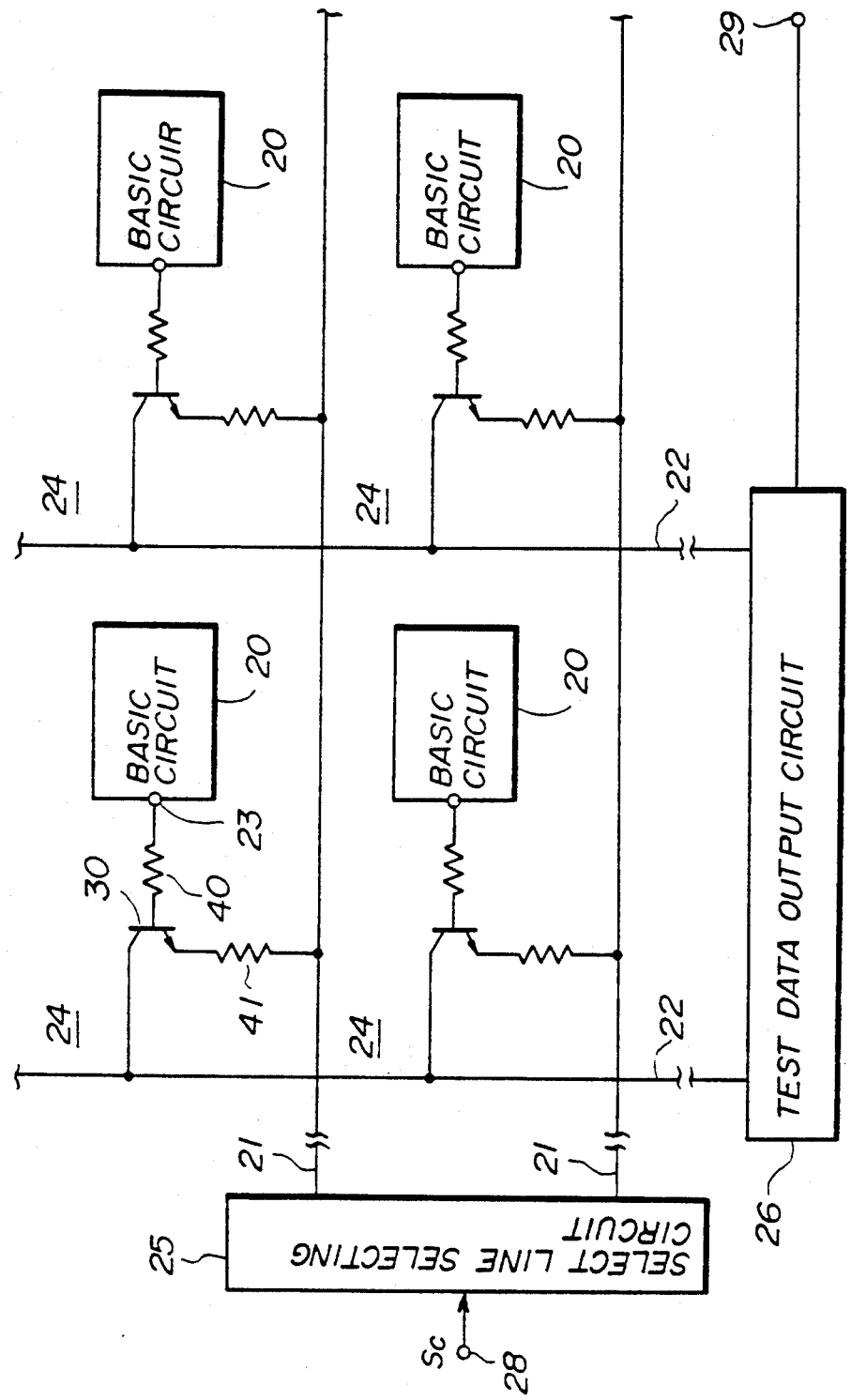

SEMICONDUCTOR INTEGRATED CIRCUIT DEVICE HAVING A TEST CIRCUIT

BACKGROUND OF THE INVENTION

The present invention generally relates to semiconductor integrated circuit devices, and more particularly to a semiconductor integrated circuit device having an array of basic circuits having bipolar transistors, and a test circuit for testing logic circuits formed of the basic circuits.

Semiconductor integrated circuit devices having bipolar transistors are high-speed devices and are widely used in high-performance digital systems, such as large scale computers for the general purpose and wide frequency range transmission systems. Recently, there has been considerable activity in the development of larger scale and higher speed bipolar semiconductor integrated circuit devices in order to further improve high-performance digital systems. Such a bipolar semiconductor integrated circuit device has a larger ratio of the number of internal gates to the number of external pins. Generally, an increase in the number of internal gates needs a more complicated device testing procedure. Thus, there is a need to provide a bipolar semiconductor integrated circuit device which has a built-in test circuit capable of easily carrying out various tests.

Japanese Laid-Open Patent Application No. 61-42934 (which corresponds to U.S. patent application Ser. No. 760 347, abandoned, continuation application Ser. No. 387,455, now abandoned, of the application Ser. No. 760,347 and divisional application Ser. No. 508,565, now abandoned, of the application Ser. No. 760,347) discloses a semiconductor integrated circuit device having a built-in test circuit. Referring to FIG. 1, the semiconductor integrated circuit device disclosed in the above-mentioned application has a chip body 1, gate cells 2 and a built-in test circuit. The built-in test circuit comprises row select lines 3, column read lines 4, switching elements 5, a row select ring counter 6, a column select ring counter 7, a data selector 8, a row select clock input terminal 9, a column select clock input terminal 10 and a monitor output terminal 11. The routing of interconnections between the gate cells 2 are determined based on the orders from users. Such interconnections for forming logic circuits are not shown for the sake of simplicity.

Output terminals of the gate cells 2 are connected to the column read lines 4 via the switching elements 5. The row select ring counter 6 selects one of the row select lines 3, and the column select ring counter 7 selects one of the column read lines 4, so that one of the gate cells 2 can be selected. Such a selecting procedure is repeatedly carried out. Data about the logical state of the output terminal of the selected gate cell 2 is transferred to the monitor output terminal 11 via the data selector 8.

The above-mentioned testing procedure is called a matrix proving method. Such a matrix proving method has no limitations regarding testing of flip-flops and latches used for forming logic circuits, and can test the logic circuits in a gate cell unit. Thus, the matrix proving method can facilitate the procedure for designing the logic circuits and can achieve high testing reliability, as compared with a conventional scan path method using a scan flip-flop.

FIG. 2 illustrates a conventional TTL circuit device based on the configuration shown in FIG. 1, and FIG. 3 illustrates a conventional MOS circuit device based on the configuration shown in FIG. 1. As shown in FIG. 2, each of the switching elements 5 shown in FIG. 1 is formed of an NPN transistor 12 and a resistor 13. As shown in FIG. 3, each of the switching elements shown in FIG. 1 is formed of an n-channel MOS transistor 14. The configurations shown in FIGS. 2 and 3 are also disclosed in the aforementioned Japanese application. It is noted that similar circuits are disclosed in D. K. Jadus, et al., "TEST PAD MULTIPLEXING", IBM Technical Disclosure Bulletin, Vol. 18, No. 7, December 1975, pp.2181–2182, or J. Canard, et al., "VOLTAGE CHECKING DEVICE", IBM Technical Disclosure Bulletin, Vol. 8, No. 5, Oct. 1965, pp.806–807.

However, the Japanese application neither discloses nor suggests a concrete configuration obtained by applying the configuration shown in FIG. 1 to an ECL (emitter coupled logic) circuit device. An ECL circuit device has gate cells formed of ECL circuits, each ECL circuit having an emitter follower circuit at the final stage thereof. If each gate cell 2 shown in FIG. 2 is formed of the ECL circuit, a large amount of current will pass through a load resistor of the emitter follower circuit, so that the output level of the ECL circuit greatly deviates from a normal value, and the entire logic circuit will malfunction. For the above-mentioned reason, it is impossible to use the switching elements consisting of the transistors 12 and the resistors 13 without any improvements when the TTL structure of each gate cell 2 is replaced by the ECL structure.

On the other hand, each gate cell may be formed of the ECL circuit by suitably designing a circuit following the MOS transistors 14. However, the combination of the ECL circuit and the MOS switching element 14 will increase the number of production steps, and will deteriorate the performance of bipolar transistors forming the ECL circuit.

SUMMARY OF THE INVENTION

It is a general object of the present invention to provide an improved semiconductor integrated circuit device having a built-in test circuit, in which the above-mentioned disadvantages of the present invention are eliminated.

A more specific object of the present invention is to provide a semiconductor integrated circuit device which has an array of ECL circuits and a built-in test circuit for testing logic circuits formed of the ECL circuits and which can be produced without increasing the number of production steps.

The above-mentioned objects of the present invention are achieved by a semiconductor integrated circuit device comprising:

an array of a plurality of basic circuits, the basic circuits including a basic circuit having an emitter coupled logic circuit and a test point; and a test circuit which tests a logic circuit formed of at least one of the basic circuits, wherein the test circuit comprises:

a plurality of select lines running in a first direction;

a plurality of read lines running in a second direction;

a plurality of switching circuits, each of the switching circuits having a first bipolar transistor having a base coupled to the test point, a collector and an emitter both connectable to connect the test point to a corresponding one of the read lines when a corresponding one of the switching circuits is turned ON in response to a select signal supplied via a corresponding one of the select lines;

select line selecting means for selecting one of the select lines and for outputting the select signal to a selected one of the select lines, the select signal turning ON selected first bipolar transistors among the plurality of first bipolar transistors, the selected first bipolar transistors being connected to the selected one of the select lines; and test data outputting means for detecting a change in a predetermined parameter related to each of the read lines and for outputting, as test data indicating information about the test point, the change to a monitor output terminal.

The above-mentioned objects of the present invention are also achieved by a semiconductor integrated circuit device comprising:

an array of a plurality of basic circuits, the basic circuits including a basic circuit having an emitter coupled logic circuit and a test point; and a test circuit which tests a logic circuit formed of at least one of the basic circuits, wherein the test circuit comprises:

a plurality of select lines running in a first direction;

a plurality of read lines running in a second direction;

a plurality of switching circuits, each of the switching circuits having a first multi-emitter bipolar transistor having a base coupled to the test point, a collector and a first emitter both connectable to connect the test point to a corresponding one of the read lines when a corresponding one of the switching circuits is turned ON in response to a select signal supplied via a corresponding one of the select lines, the first multi-emitter bipolar transistor having a second emitter which functions as an output terminal of the emitter coupled logic circuit;

select line selecting means for selecting one of the select lines and for outputting the select signal to a selected one of the select lines, the select signal turning ON selected first multi-emitter bipolar transistors among the plurality of first multi-emitter bipolar transistors, the selected first multi-emitter bipolar transistors being connected to the selected one of the select lines; and test data outputting means for detecting a change in a predetermined parameter related to each of the read lines and for outputting, as test data indicating information about the test point, the change to a monitor output terminal.

BRIEF DESCRIPTION OF THE DRAWINGS

Other objects, features and advantages of the present invention will become apparent from the following detailed description when read in conjunction with the accompanying drawings, in which:

FIG. 5A is a block diagram illustrating an outline of a first preferred embodiment of the present invention;

FIG. 14 is a block diagram illustrating an outline of a fifth preferred embodiment of the present invention;

DESCRIPTION OF THE PREFERRED EMBODIMENTS

Figure 1:
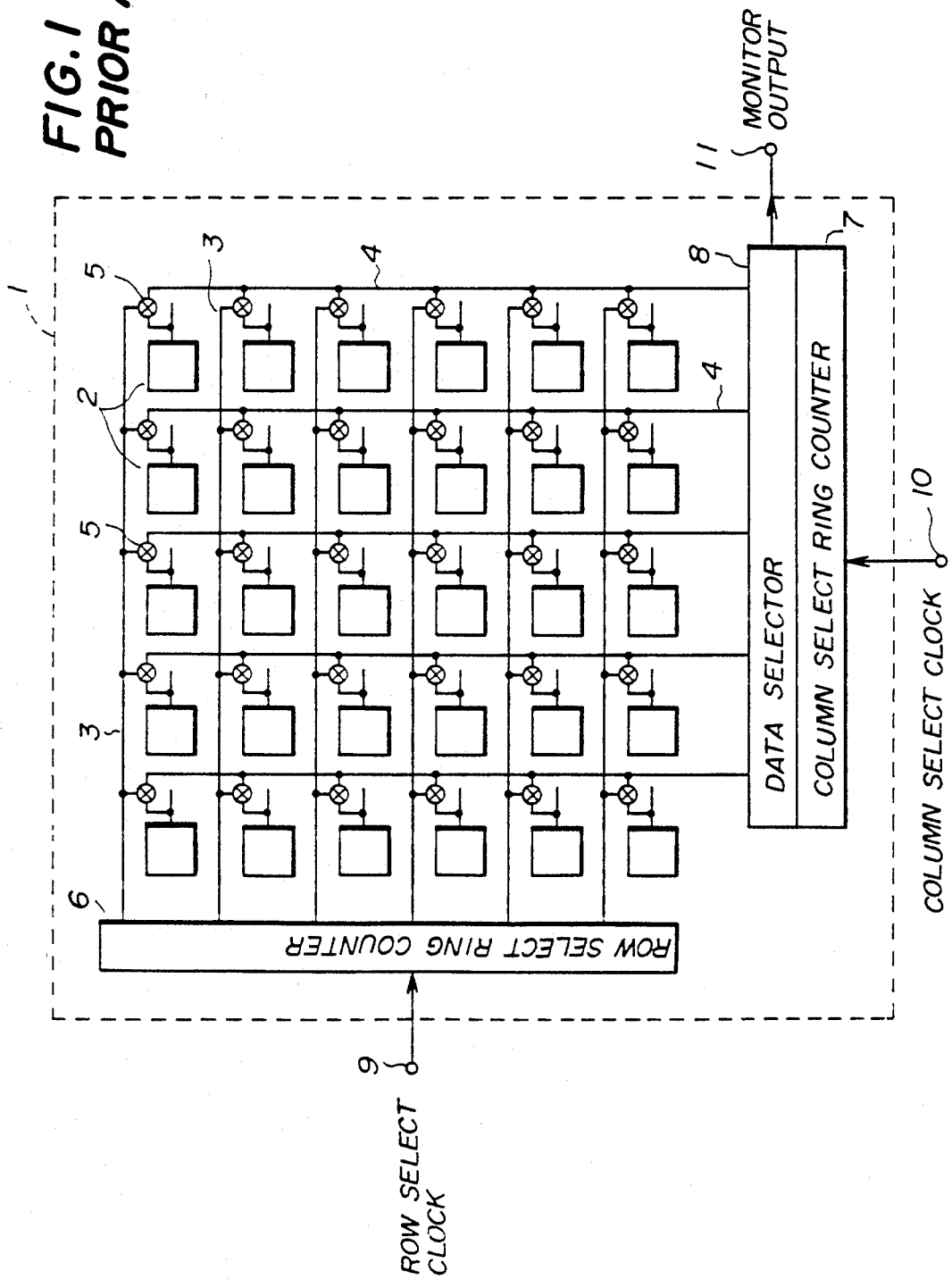
FIG 1 is a block diagram of a conventional semiconductor integrated circuit device having a built-in test circuit.
Figure 3:
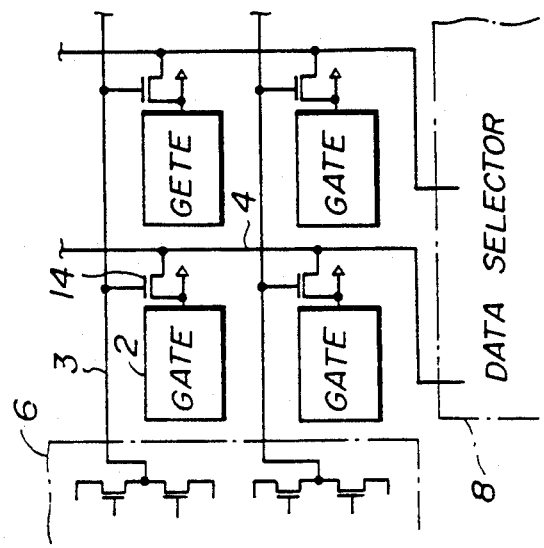
FIG. 3 is a block diagram of a conventional MOS semiconductor device having the built-in test circuit shown in FIG. 1.
Figure 2:
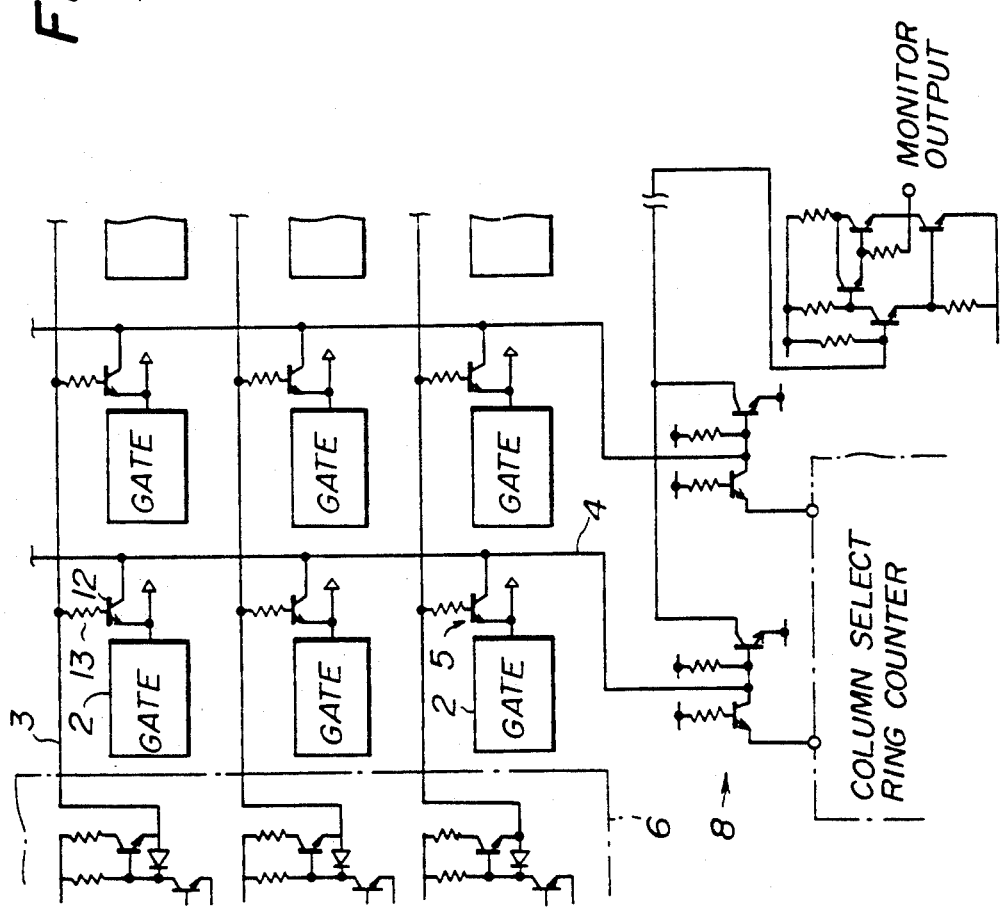
FIG. 2 is a block diagram of a conventional TTL circuit device having the built-in test circuit shown in FIG. 1.
Figure 4:
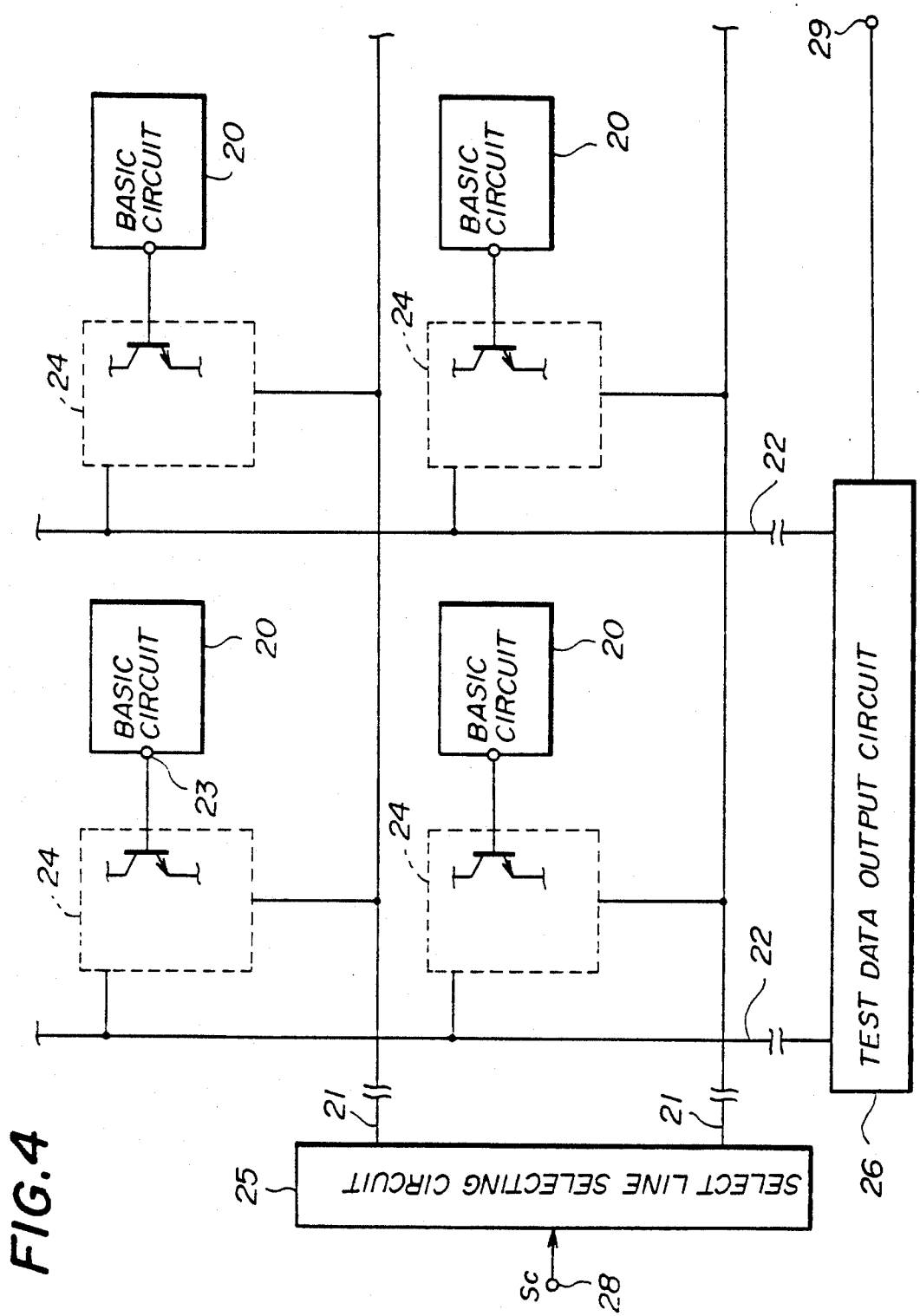
FIG. 4 is a block diagram illustrating an outline of the present invention.

FIG. 4 is a block diagram showing the principle of a semiconductor integrated circuit device according to the present invention. The device shown in FIG. 4 has an array of a plurality of basic circuits (gate cells) 20 formed of bipolar transistors, and a test circuit for testing the basic circuits 20. The test circuit has a plurality of select lines 21 running in a first direction, and a plurality of read lines 22 running in a second direction substantially perpendicular to the first direction. The test circuit also includes a plurality of switching circuits 24, each of which is provided between (i.e., interconnects) the corresponding basic circuit 20 and the corresponding read line 22. Each of the switching circuits 24 has at least one bipolar transistor having a base, which is directly connected to a test point 23 (of the associated basic circuit 20) or connected thereto via a resistor (not shown), so that each of the switching circuits 24 is turned ON/OFF via the select line 21. When each of the switching circuits 24 is ON, the test point 23 is connected to the corresponding read line 22. Further, the test circuit has a select line selecting circuit 25 connected to the select lines 21. The select line selecting circuit 25 selects a desired one of the select lines 21, and turns ON the switching circuit 24 connected to the selected select line 21. Furthermore, the test circuit has a test data output circuit 26, which detects a change in current passing through the selected read line 22 or a change in the potential of the selected read line 22, and outputs, as test data, a level state of the test point 23 of the selected basic circuit 20.

The term, "basic circuit" means a basic circuit (logic cell) necessary to form logic circuits. For example, the basic circuit includes gates, such as OR circuits and NOR circuits, flip-flops and the like. Further, the device shown in FIG. 4 has a select line control signal input terminal 28, and a test data output terminal 29. A select line control signal (clock signal) Sc indicating which one of the basic circuits 20 should be selected is applied to the select line control signal input terminal 28. The above-mentioned test data (monitor data) from the test data output circuit 26 is output via the test data output terminal 29.

FIG. 5A is a block diagram illustrating an outline of a semiconductor integrated circuit device according to a first preferred embodiment of the present invention. Each of the switching circuits 24 shown in FIG. 5A comprises first and second bipolar transistors 30 and 31, and a constant-current source 32. The collector of the first transistor 30 is connected to a high-voltage power supply line 33 set to a first D.C. voltage $V_{CC}$ (=0 volt, for example), and the base thereof is directly connected to the test point of the basic circuit 20 or connected thereto via a resistor (not shown). The collector of the second transistor 31 is connected to the corresponding read line 22, and the base thereof is connected to a reference voltage input terminal 34, which receives a reference voltage $V_R$. The respective emitters of the first and second transistors 30 and 31 are connected to the constant-current source 32, which is connected to a low-voltage power supply line 35 set to a second D.C. voltage $V_{EE}$ lower than the first D.C. voltage $V_{CC}$. The constant-current source 32 is turned ON/OFF by the corresponding select line 21.

When the logical state of the test point 23 is a high level in the state where the switching circuit 24 is ON (the constant-current source 32 is ON), the first and second transistors 30 and 31 are ON and OFF, respectively, so that no current passes through the read line 22. On the other hand, when the logical state of the test point 23 is a low level in the state where the switching circuit 24 is ON, the first and second transistors 30 and 31 are OFF and ON, respectively, so that a current defined by the constant-current source 32 passes through the read line 22.

Figure 5B:
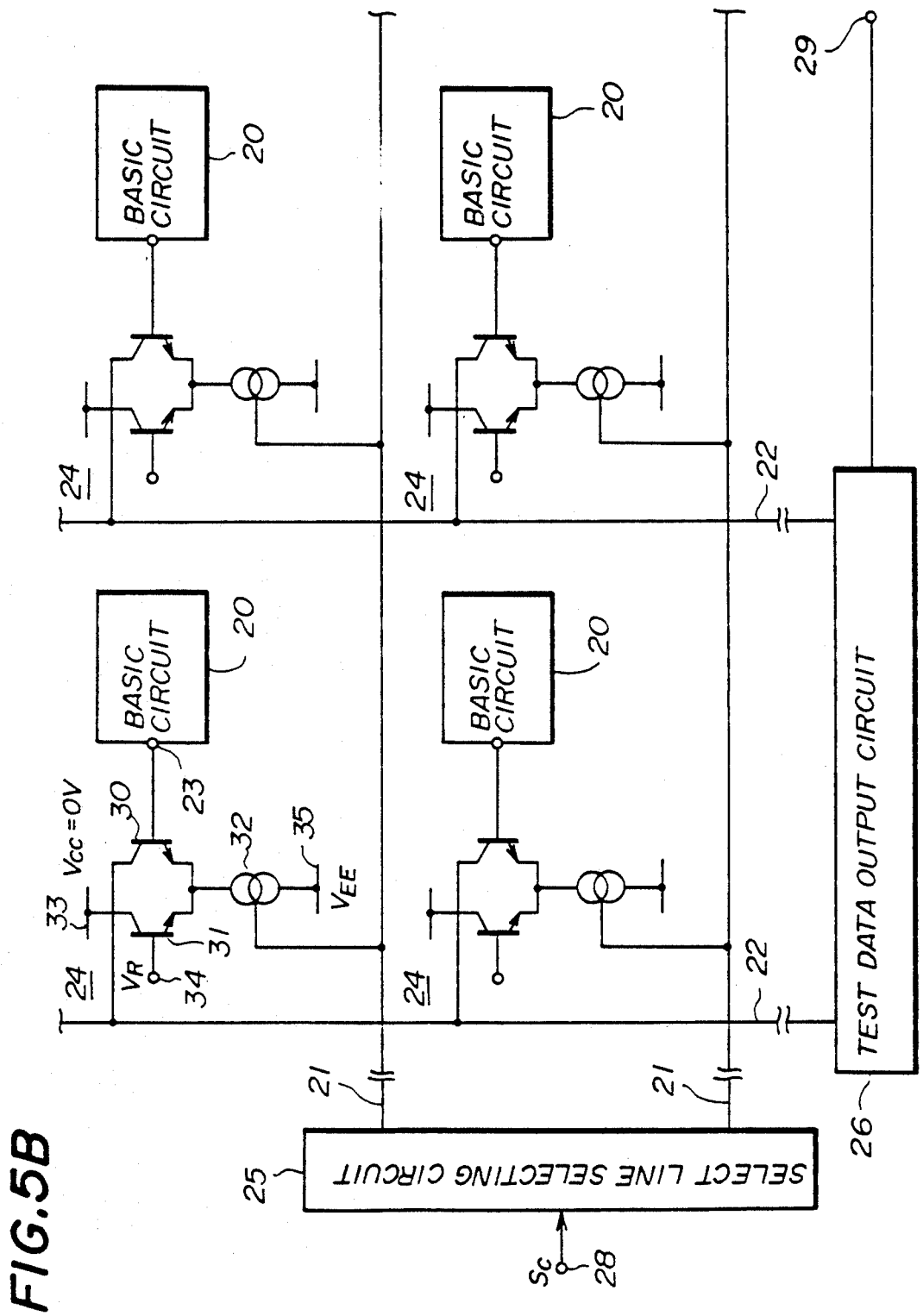
FIG. 5B is a block diagram illustrating a variation of the configuration shown in FIG. 5A.

FIG. 5B is a block diagram illustrating a first variation of the circuit shown in FIG. 5A. The circuit shown in FIG. 5B is different from that shown in FIG. 5A in that the collector of the first transistor 30 is connected to the corresponding read line 22, and the collector of the second transistor 31 is connected to the high-voltage power supply line 33. When the logical state of the test point 23 is high in the state where the switching circuit 24 is ON, the first and second transistors 30 and 31 are ON and OFF, respectively, so that a current defined by the constant-current source 32 passes through the read line 22. On the other hand, when the logical state of the test point 23 is low in the above-mentioned state, the first and second transistors 30 and 31 are OFF and ON, respectively, so that no current passes through the read line 22.

Figure 6A:
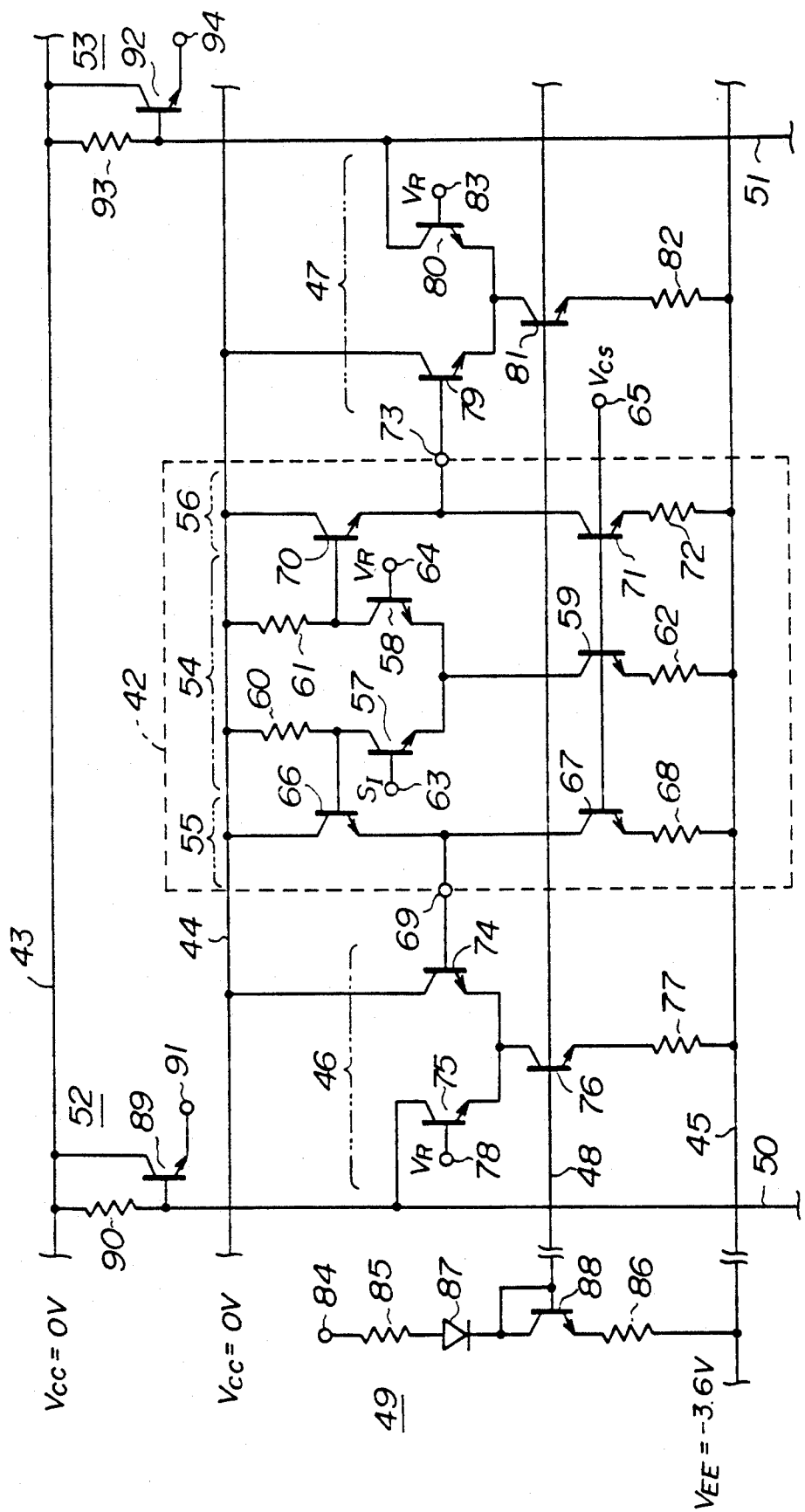
FIG. 6A is a circuit diagram of the first preferred embodiment of the present invention shown in FIG. 5A.

FIG. 6A is a circuit diagram illustrating the circuit shown in FIG. 5A in more detail. The device shown in FIG. 6A has an ECL basic circuit 42, which corresponds to the basic circuit 20 shown in FIG. 5A. A high-voltage power supply line 44 and a low-voltage power supply line 45 are connected to the ECL basic circuit 42. The high-voltage power source line 44 is maintained at the high potential $V_{CC}$ (0 volt, or "0U", for example), and the low-voltage power supply line 45 is maintained at the low potential $V_{EE}$ (−3.6 volts, for example). Switching devices 46 and 47 are connected to the ECL basic circuit 42 via logic signal output terminals 69 and 73, respectively. A select line 48 (which corresponds to the select line 21 shown in FIG. 5A) is connected to the switching circuits 46 and 47. The select line 48 is connected to an output circuit part of the select line select circuit 25 shown in FIG. 5A. Read lines 50 and 51 (which correspond to the read lines 22 shown in FIG. 5A) are connected to the switching circuits 46 and 47, respectively. Read line current detection circuits 52 and 53, which are parts of the test data output circuit 26 shown in FIG. 5A, are connected to the read lines 50 and 51, respectively.

The ECL basic circuit 42 shown in FIG. 6A is a one-input NOR/OR circuit, and has a current switching circuit 54, and two emitter follower circuits 55 and 56. The current switching circuit 54 has NPN transistors 57, 58 and 59, and resistors 60, 61 and 62. The collector of the NPN transistor 57 is coupled to the high-voltage power supply line 44 via the resistor 60, and the base thereof is connected to a logic signal input terminal 63, which receives an input logic signal $S_I$. The emitter of the NPN transistor 57 is connected to the emitter of the NPN transistor 58 and the collector of the NPN transistor 59. The collector of the NPN transistor 58 is coupled to the high-voltage power supply line 44 via the resistor 61, and the base thereof is connected to a reference voltage input terminal 64, which receives the reference voltage $V_R$ equal to, for example, −1.2 volts. The base of the NPN transistor 59 is connected to a current source voltage input terminal 65, which receives a current source voltage $V_{CS}$, and the emitter thereof is coupled to the low-voltage power supply line 45 via the resistor 62.

The emitter follower circuit 55 has NPN transistors 66 and 67, and a resistor 68. The collector of the NPN transistor 66 is connected to the high-voltage power supply line 44, and the base thereof is connected to the collector of the NPN transistor 57. The emitter of the NPN transistor 66 is connected to a logic signal output terminal 69 and the collector of the NPN transistor 67. The base of the NPN transistor 67 is connected to the current source voltage input terminal 65, and the emitter thereof is connected to the low-voltage power supply line 45 via the resistor 68.

The emitter follower circuit 56 has NPN transistors 70 and 71, and a resistor 72. The collector of the NPN transistor 70 is connected to the high-voltage power supply line 44, and the base thereof is connected to the collector of the NPN transistor 58. The emitter of the NPN transistor 70 is connected to a logic signal output terminal 73 and the collector of the NPN transistor 71. The base of the NPN transistor 71 is connected to the current source voltage input terminal 65, and the emitter thereof is coupled to the low-voltage power supply line 45 via the resistor 72.

When the input logic signal $S_I$ has a high level, the logic signal output terminal 69 has a low level, and the logic signal output terminal 73 has a high level. On the other hand, when the input logic signal S$_I$ has a low level, the logic signal output terminals 69 and 73 have the high level and the low level, respectively. It will be noted that the high level is set equal to, for example, −0.8 volts, and the low level is set equal to, for example, −1.6 volts. The ECL basic circuit 42 is connected to other ECL basic circuits (not shown) so as to form a desired logic circuit.

The switching circuit 46 comprises a current switching circuit, which is made up of NPN transistors 74, 75 and 76, and a resistor 77. The collector of the NPN transistor 74 is connected to the high-voltage power supply line 44, and the base thereof is connected to the logic signal output terminal 69. The emitter of the NPN transistor 74 is connected to the emitter of the NPN transistor 75 and the collector of the NPN transistor 76. The collector of the NPN transistor 75 is connected to the corresponding read line 50, and the base thereof is connected to the reference voltage input terminal 78. The base of the NPN transistor 76 is connected to the select line 48, and the emitter thereof is coupled to the low-voltage power supply line 45 via the resistor 77.

The switching circuit 47 comprises a current switching circuit, which is composed of NPN transistors 79, 80 and 81, and a resistor 82. The collector of the NPN transistor 79 is connected to the high-voltage power supply line 44, and the base thereof is connected to the logic signal output terminal 73. The emitter of the NPN transistor 79 is connected to the emitter of the NPN transistor 80 and the collector of the NPN transistor 81. The collector of the NPN transistor 80 is connected to the corresponding read line 51, and the base thereof is connected to a reference voltage input terminal 83. The base of the NPN transistor 81 is connected to the corresponding select line 48, and the emitter thereof is coupled to the low-voltage power supply line 45 via the resistor 82.

The output circuit 49 which corresponds to the select line selecting circuit 25 shown in FIG. 5A comprises a terminal 84, resistors 85 and 86, a diode 87, and an NPN transistor 88. The terminal 84 is coupled to the anode of the diode 87 through the resistor 85, the cathode of which is connected to the collector of the NPN transistor 88. The base of the NPN transistor 88 is connected to the collector thereof and the corresponding select line 48, and the emitter thereof is coupled to the low-voltage power supply line 45 via the resistor 86. When the select line 48 is selected, a voltage equal to, for example, −0.8 volts is applied to the terminal 84. The voltage of the select line 48 is set equal to −2.2 volts (hereafter this voltage is referred to as a select voltage V$_{SEL-ON}$), so that both the NPN transistors 76 and 81, which function as constant-current sources, are ON and the two switching circuits 46 and 47 are ON. On the other hand, when the select line 48 is not being selected, a voltage of −2.0 volts is applied to the terminal 84, and the voltage of the select line 48 is set equal to −3.1 volts, so that the NPN transistors 76 and 81 are OFF, and the switching circuits 46 and 47 are OFF.

The read line current detection circuit 52 comprises an NPN transistor 89 and a resistor 90. The collector of the NPN transistor 89 is connected to the high-voltage power supply line 43. The base of the NPN transistor 89 is connected to the read line 50 and to the high-voltage power supply line 43 via the resistor 90. The emitter of the NPN transistor 89 is connected to a data output terminal 91.

The read line current detection circuit 53 comprises an NPN transistor 92 and a resistor 93. The collector of the NPN transistor 92 is connected to the high-voltage power supply line 43. The base of the NPN transistor 92 is connected to the read line 51, and to the high-voltage power supply line 43 via the resistor 93. The emitter of the NPN transistor 92 is connected to a data output terminal 94. Although not shown for the sake of simplicity, data obtained at the data output terminals 91 and 94 are output to external pins via a compression circuit or a select circuit.

A description will now be given of the operation of the circuit shown in FIG. 6A. During test, when the select line 48 is selected, the select line 48 is set to the select voltage V$_{SEL-ON}$ (equal to −2.2 volts, for example), so that the NPN transistors 76 and 81 are turned ON, that is, the switching circuits 46 and 47 are ON. If the ECL basic circuit 42 operates normally, the logic signal output terminals 69 and 73 are set to the low and high levels, respectively, when the input logic signal S$_I$ has a high-level logic value. On the other hand, when the input logic signal S$_I$ has a low-level logic value in the state where the ECL basic circuit 42 operates normally, the logic signal output terminals 69 and 73 are set to the high and low levels, respectively.

In the switching circuit 46, when the logic signal output terminal 69 is maintained at the high level, the NPN transistor 74 is in the active (i.e., on) state, and the NPN transistor 75 are in the OFF state. As a result, no current passes through the read line 50, so that the read line 50 is equal to 0 volt, and the voltage of the data output terminal 91 is equal to (0−V$_{BE}$), for example, −0.8 volts where V$_{BE}$ is the base-emitter voltage of the NPN transistor 74. That is, the data output terminal 91 is set to the high level which is equal to that of the logic signal output terminal 69. On the other hand, when the logic signal output terminal 69 is at the low level, the NPN transistor 74 is OFF, and the NPN transistor 75 is ON. Thus, a current defined by the following formula passes through the read line 50:

$$(V_{SEL-ON} - V_{BE} - V_{EE})/R77$$

where R77 is the resistance value of the resistor 77. As a result, the voltage of the read line 50 is equal to:

$$[(V_{SEL-ON} - V_{BE} - V_{EE})/R77] \, R90 - V_{BE}$$

where R90 is the resistance value of the resistor 90. Thus, the voltage of the data output terminal 91 is as follows:

$$[(V_{SEL-ON} - V_{BE} - V_{EE})/R77] \, R90.$$

The voltage of the data output terminal 91 is equal to, for example, −1.6 volts.

In the switching circuit 47, when the logic signal output terminal 73 is at the high level, the NPN transistor 79 is in the active state, and the NPN transistor 80 is in the OFF state. Thus, no current passes through the read line 51. As a result, the voltage of the read line 51 is zero volt, and the voltage of the data output terminal 94 is equal to (0−V$_{BE}$), for example, −0.8 volts. That is, the voltage of the data output terminal 94 is the high level equal to that of the logic signal output terminal 73. On the other hand, when the logic signal output terminal 73 is at the low level, the NPN transistor 79 is in the OFF state, and the NPN transistor 80 is in the active state. Thus, a current defined by the following formula passes through the read line 51:

$$(V_{SEL-ON} - V_{BE} - V_{EE})/R82$$

where R82 is the resistance value of the resistor 82. As a result, the voltage of the read line 51 is as follows:

$$[(V_{SEL-ON} - V_{BE} - V_{EE})/R82] R93$$

where R93 is the resistance value of the resistor 93. As a result, the voltage of the data output terminal 94 is as follows:

$$[(V_{SEL-ON} - V_{BE} - V_{EE})/R82] R93 - V_{BE}.$$

The voltage of the data output terminal 94 is equal to $-1.6$ volts, for example. In the above-mentioned way, the voltages of the data output terminals 91 and 94 are output to an external device, so that it is possible to determine whether or not the ECL basic circuit 42 operates normally on the basis of the readout voltage information.

According to the above-mentioned first embodiment of the present invention, the device has the built-in test circuit, and the circuit for reading out the logical states of the logic signal output terminals 69 and 73, that is, the switching circuits 46 and 47 and the read line current detection circuits 52 and 53 are formed of bipolar transistors and resistors which match the ECL basic circuits 42. As a result, it becomes possible to test logic circuits formed of ECL basic circuits 42 by the matrix proving method and to form the test circuit without an increased number of production steps.

Figure 6B:
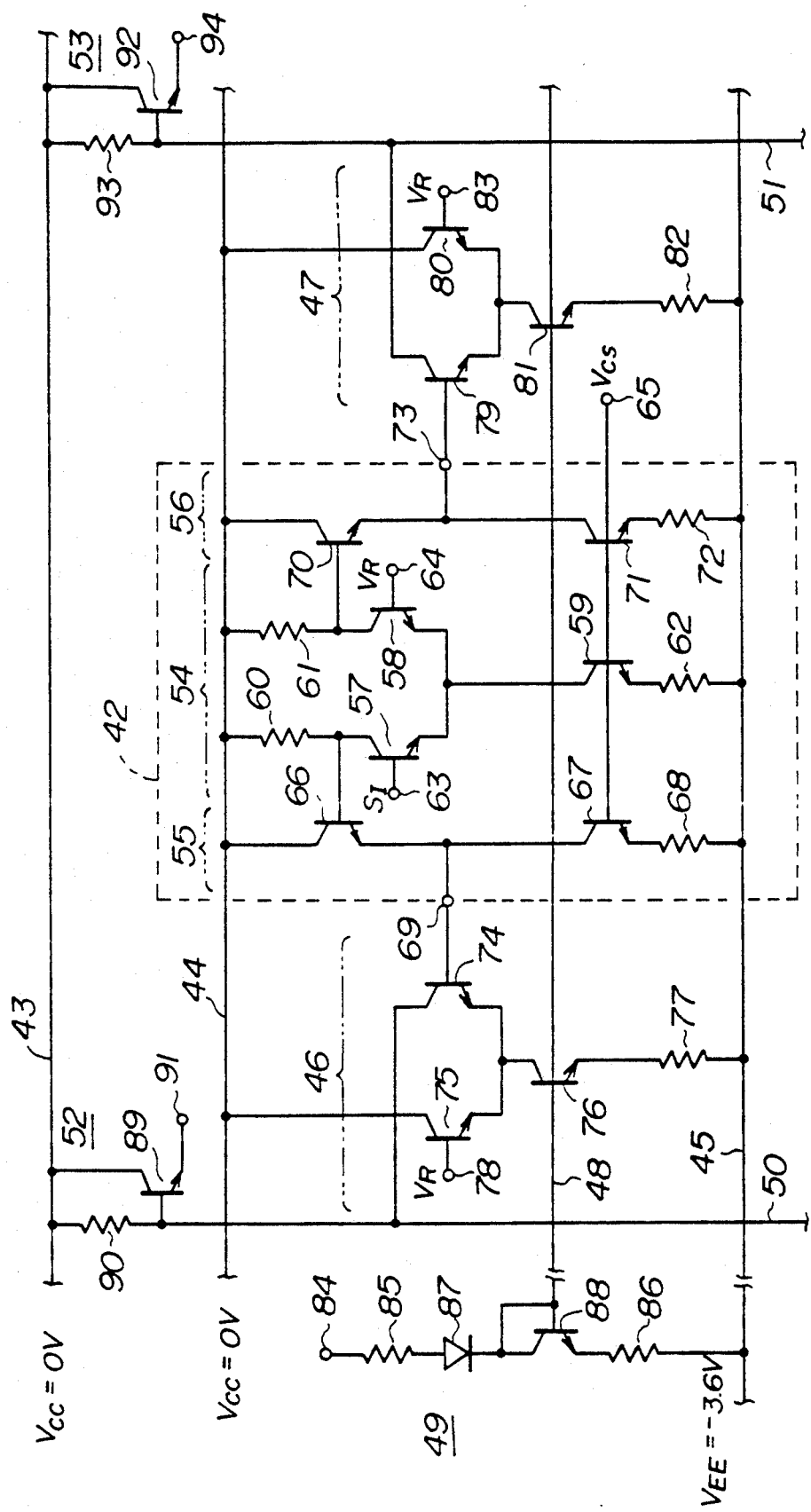
FIG. 6B is a circuit diagram of the variation shown in FIG. 5B.

FIG. 6B illustrates the configuration shown in FIG. 5B in more detail. The circuit shown in FIG. 6B is different from that shown in FIG. 6A in the structures of the switching circuits 46 and 47. The collector of the NPN transistor 74 of the switching circuit 46 is connected to the corresponding read line 50, and the collector of the NPN transistor 75 is connected to the high-voltage power supply line 44. Similarly, the collector of the NPN transistor 79 is connected to the corresponding read line 51, and the collector of the NPN transistor 80 is connected to the high-voltage power supply line 44. The other arrangements of the circuit shown in FIG. 6B are the same as those shown in FIG. 6A.

During operation, in the switching circuit 46, when the logic signal output terminal 69 is at the high level, the NPN transistor 74 is in the active state, and the NPN transistor 75 is in the OFF state, so that a current defined by the following passes through the read line 50:

$$(V_{SEL-ON} - V_{BE} - V_{EE})/R77.$$

Thus, the voltage of the read line 50 is as follows:

$$[(V_{SEL-ON} - V_{BE} - V_{EE})/R77] R90.$$

As a result, the voltage of the data output terminal 91 is written as follows:

$$[(V_{SEL-ON} - V_{BE} - V_{EE})/R77] R90 - V_{BE}$$

and is equal to, for example, $-1.6$ volts. On the other hand, when the logic signal output terminal 69 is at the low level, the NPN transistor 74 is in the OFF state, and the NPN transistor 75 is in the active state. Thus, no current passes through the read line 50, so that the voltage of the read line 50 is 0 volt, and the voltage of the data output terminal 91 is equal to $(0 - V_{BE})$ volts, for example, $-0.8$ volts.

In the switching circuit 47, when the logic signal output terminal 73 is at the high level, the NPN transistor 79 is in the active state, and the NPN transistor 80 are in the OFF. Thus, a current defined by the following passes through the read line 51:

$$(V_{SEL-ON} - V_{BE} - V_{EE})/R82.$$

As a result, the voltage of the read line 51 is:

$$[(V_{SEL-ON} - V_{BE} - V_{EE})/R82] R93.$$

Hence, the voltage of the data output terminal 94 is:

$$[(V_{SEL-ON} - V_{BE} - V_{EE})/R82] R93 - V_{BE}$$

and is equal to, for example, $-1.6$ volts. On the other hand, when the logic signal output terminal 73 is at the low level, the NPN transistor 79 is OFF and the NPN transistor 80 is in the active state, no current passes through the read line 51, so that the voltage of the read line 51 is equal to zero volt, and the voltage of the data output terminal 94 is equal to $(0 - V_{BE})$ volts, for example, $-0.8$ volts. In the above-mentioned way, it is possible to output the voltages of the data output terminals 91 and 94 to an external device and determine whether or not the ECL logic circuit 42 operates normally on the basis of the readout voltages.

Figure 7:
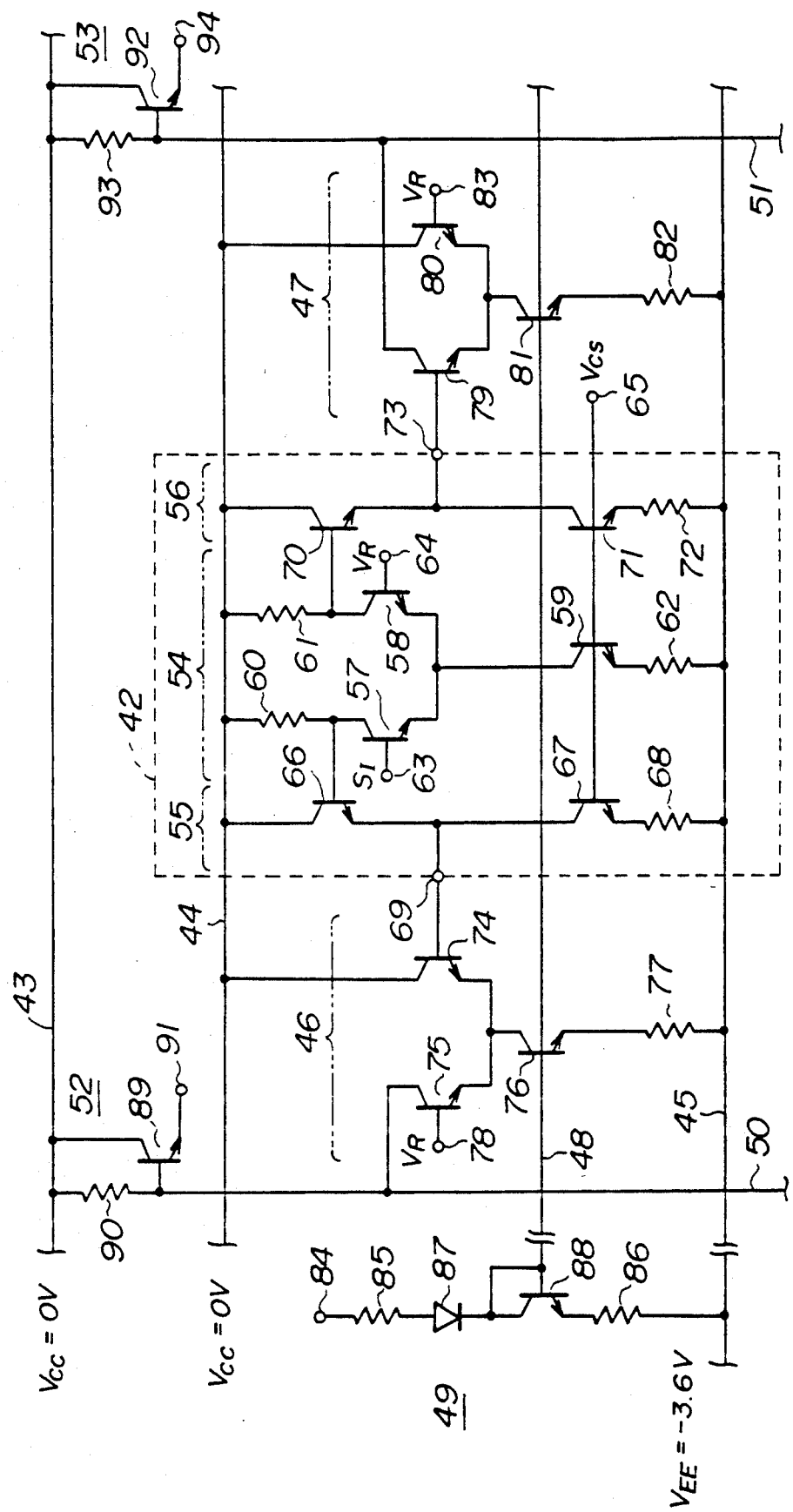
FIG. 7 is a circuit diagram illustrating a combination of the circuits shown in FIG. 6A and FIG. 6B.

FIG. 7 is a circuit diagram of a second variation of the configuration shown in FIG. 6B. In The second variation shown in FIG. 7 corresponds to a combination of the configurations shown in FIGS. 6A and 6B. The switching circuit 46 shown in FIG. 7 has the same configuration as that shown in FIG. 6A, and the switching circuit 47 shown in FIG. 7 has the same configuration as that shown in FIG. 6B. Thus, the switching circuit 46 shown in FIG. 7 operates in the same way as that shown in FIG. 6A, and the switching circuit 47 shown in FIG. 7 operates in the same way as that shown in FIG. 6B. The other parts of the circuit shown in FIG. 7 are the same as those of the first and second embodiments of the present invention.

Figure 8:
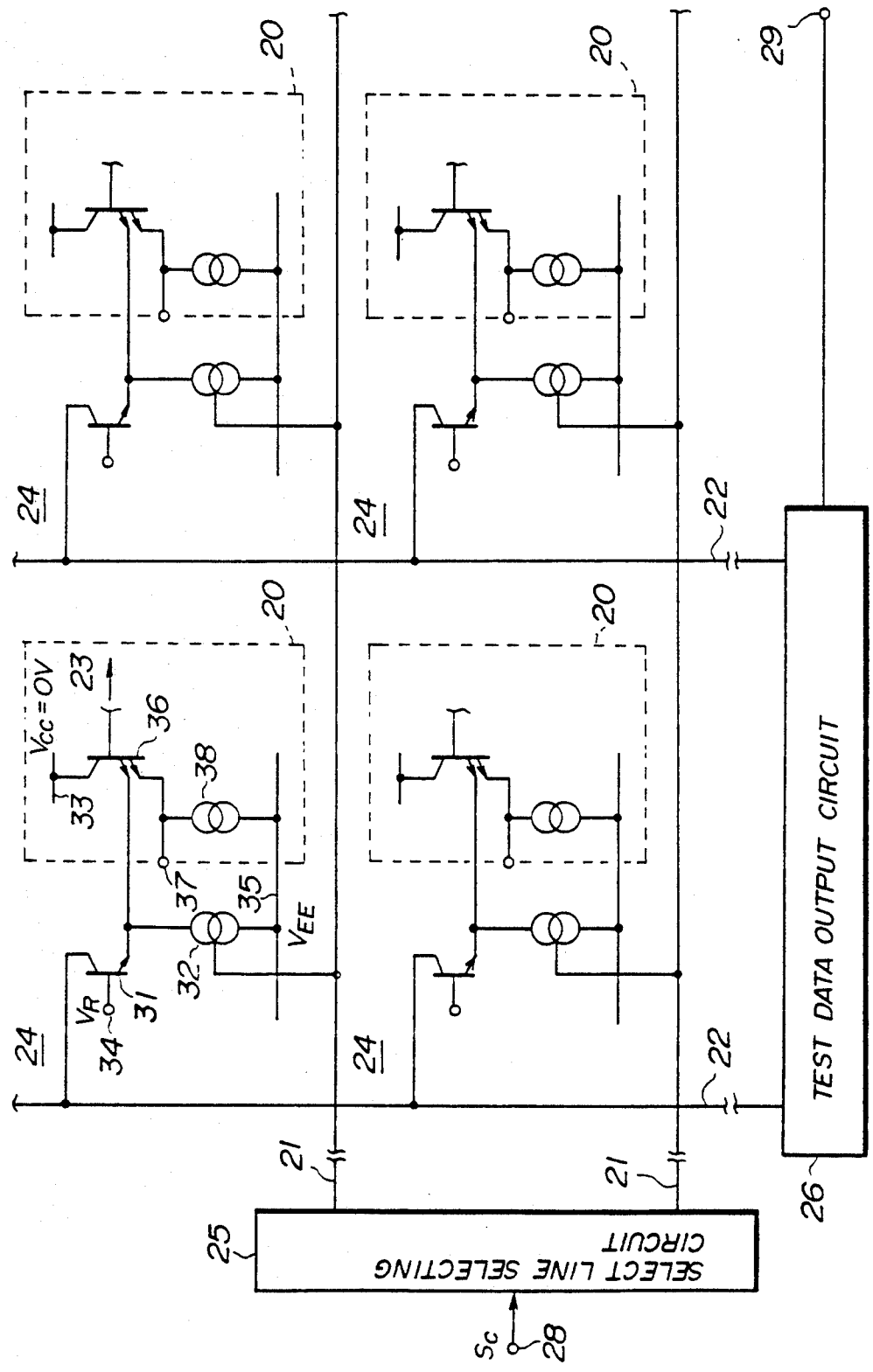
FIG. 8 is a block diagram illustrating an outline of a second preferred embodiment of the present invention.

A description will now be given of a semiconductor integrated circuit device according to a second preferred embodiment of the present invention. FIG. 8 illustrates an outline of the device according to the second preferred embodiment of the present invention. The switching circuit 24 has a first transistor 36 of a multi-emitter type provided in the basic circuit 20, the aforementioned second transistor 31 of the single emitter type outside of the basic circuit 20, and the constant-current source 32 outside of the basic circuit 20. The collector of the first transistor 36 receives the first D.C. voltage $V_{CC}$, and the base thereof is connected to the test point 23. The collector of the second transistor 31 is connected to the corresponding read line 22, and the base thereof is connected to the reference voltage input terminal 34. The emitter of the transistor 31 is connected to a first emitter of the first transistor 36. The constant-current source 32 is connected between the low-voltage power supply line 35 and both the first emitter of the first transistor 36 and the emitter of the second transistor 31. The ON and OFF states of the constant-current source 32 are controlled via the select line 21. The second emitter of the first transistor 36 is connected to, for example, the logic signal output terminal 37 and the constant-current source 38.

When the logic state of the test point 23 is the high level in the state where the switching circuit 24 is ON, the first transistor 36 is in the active state, and the second transistor 31 is OFF, no current passes through the read line 22. On the other hand, when the logic state of the test point 23 is the low level in the state where the switching circuit 24 is ON, the first transistor 36 is OFF, and the second transistor 31 is ON, a current defined by the constant-current source 32 passes through the read line 22.

Figure 9:
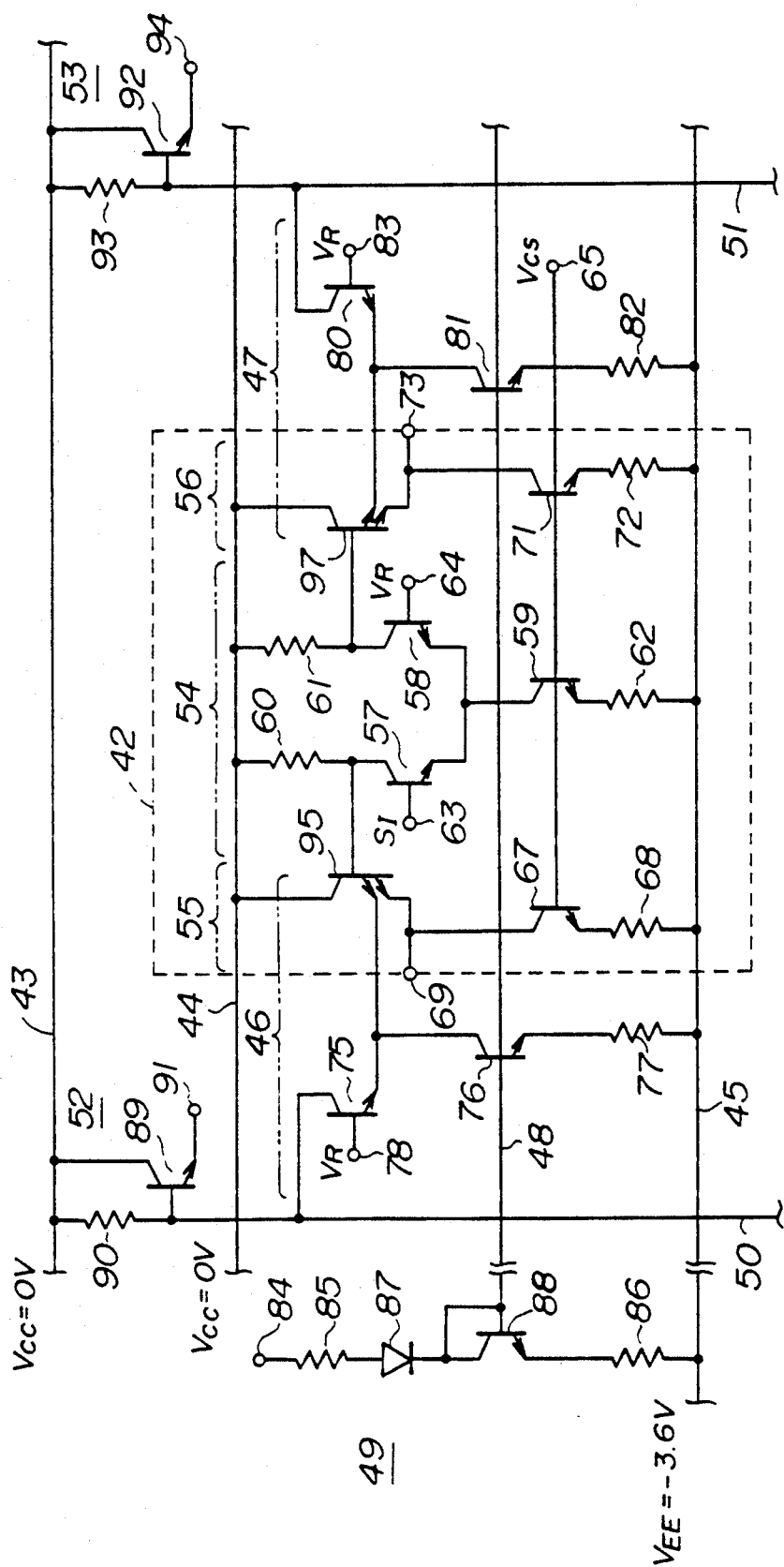
FIG. 9 is a circuit diagram of the second preferred embodiment of the present invention shown in FIG. 8.

FIG. 9 is a circuit diagram of the configuration shown in FIG. 8 in more detail. The circuit shown in FIG. 9 differs from the circuit shown in FIG. 6A in that the NPN transistors 74 and 66 are replaced by a multi-emitter type NPN transistor 95 provided in the ECL basic circuit 42, and the NPN transistors 79 and 70 are replaced by a multi-emitter type NPN transistor 97 provided in the ECL basic circuit 42.

The ECL basic circuit 42 has two emitter follower circuits 55 and 56, and the current switching circuit 54. The emitter follower circuit 55 has the multi-emitter type NPN transistor 95 having first and second emitters, the NPN transistor 67 and the resistor 68. The collector of the NPN transistor 95 is connected to the high-voltage power supply line 44, and the base thereof is connected to the collector of the NPN transistor 57. The second emitter of the NPN transistor 95 is connected to the logic signal output terminal 69 and the collector of the NPN transistor 67. The other parts of the emitter follower circuit 55 are the same as those of the emitter follower circuit 55 shown in FIG. 6A.

The emitter follower circuit 56 has the multi-emitter type NPN transistor 97 having first and second emitters, the NPN transistor 71 and the resistor 72. The collector of the NPN transistor 97 is connected to the high-voltage power supply line 44, and the base thereof is connected to the collector of the NPN transistor 58. The second emitter of the NPN transistor 97 is connected to the logic signal output terminal 73 and the collector of the NPN transistor 71. The other parts of the emitter follower circuit 56 are the same as those of the emitter follower circuit 56 shown in FIG. 6A.

The switching circuit 46 shown in FIG. 9 has the NPN transistors, 95, 75 and 76, and the resistor 77. The collector of the NPN transistor 75 is connected to the corresponding read line 50, and the base thereof is connected to the reference voltage input terminal 78. The emitter of the NPN transistor 75 is connected to the first emitter of the NPN transistor 95 and the collector of the NPN transistor 76. The other parts of the switching circuit 46 are the same as those of the switching circuit 46 shown in FIG. 6A.

The switching circuit 47 has the NPN transistors 97, 80 and 81, and the resistor 82. The collector of the NPN transistor 80 is connected to the corresponding read line 51, and the base thereof is connected to the reference voltage input terminal 83. The emitter of the NPN transistor 80 is connected to the first emitter of the NPN transistor 97 and the collector of the NPN transistor 81. The other parts of the switching circuit 47 are the same as those of the switching circuit 47 shown in FIG. 6A.

During testing, when the collector voltage of the the NPN transistor 57 of the switching circuit 46 is high, the NPN transistor 95 is ON and the NPN transistor 75 is OFF. Thus, no current passes through the read line 50, so that the voltage of the read line 50 is zero volt, and the voltage of the data output terminal 91 is equal to $(0-V_{BE})$ volts, for example, $-0.8$ volts. On the other hand, when the collector voltage of the NPN transistor 57 is low, the NPN transistor 95 is OFF, and the NPN transistor 75 is ON. Thus, a current defined by the following passes through the read line 50:

$$(V_{SEL-ON}-V_{BE}-V_{EE})/R77$$

Thus, the voltage of the read line 50 is written as follows:

$$[(V_{SEL-ON}-V_{BE}-V_{EE})/R77] R90.$$

As a result, the voltage of the data output terminal 91 is:

$$[(V_{SEL-ON}-V_{BE}-V_{EE})/R77] R90-V_{BE}$$

and is, for example, $-1.6$ volts.

When the collector voltage of the NPN transistor 58 of the switching device 47 is high, the NPN transistor 97 is ON, and the NPN transistor 80 is OFF. Thus, no current passes through the read line 51, so that the voltage of the read line 51 is zero volt, and the voltage of the data output terminal 94 is equal to $(0-V_{BE})$ volts, for example, $-0.8$ volts. On the other hand, when the collector voltage of the NPN transistor 58 is low, the NPN transistor 97 is OFF, and the NPN transistor 80 is ON. Thus, a current defined by the following passes through the read line 51:

$$(V_{SEL-ON}-V_{BE}-V_{EE})/R82.$$

Thus, the voltage of the read line 51 is written by:

$$[(V_{SEL-ON}-V_{BE}-V_{EE})/R82] R93.$$

As a result, the voltage of the data output terminal 94 is:

$$[(V_{SEL-ON}-V_{BE}-V_{EE})/R82] R93-V_{BE}$$

and is, for example, $-1.6$ volts. In the above-mentioned way, it is possible to output the voltages of the data output terminals 91 and 94 to an external circuit and thus determine whether or not the ECL basic circuit 42 is normally operating on the basis of the readout voltages. It will be noted that the circuit shown in FIG. 9 is simpler than that shown in FIG. 6A because the NPN transistors 95 and 97 are used in common for the ECL basic circuit 42 and the switching circuits 46 and 47.

Figure 10:
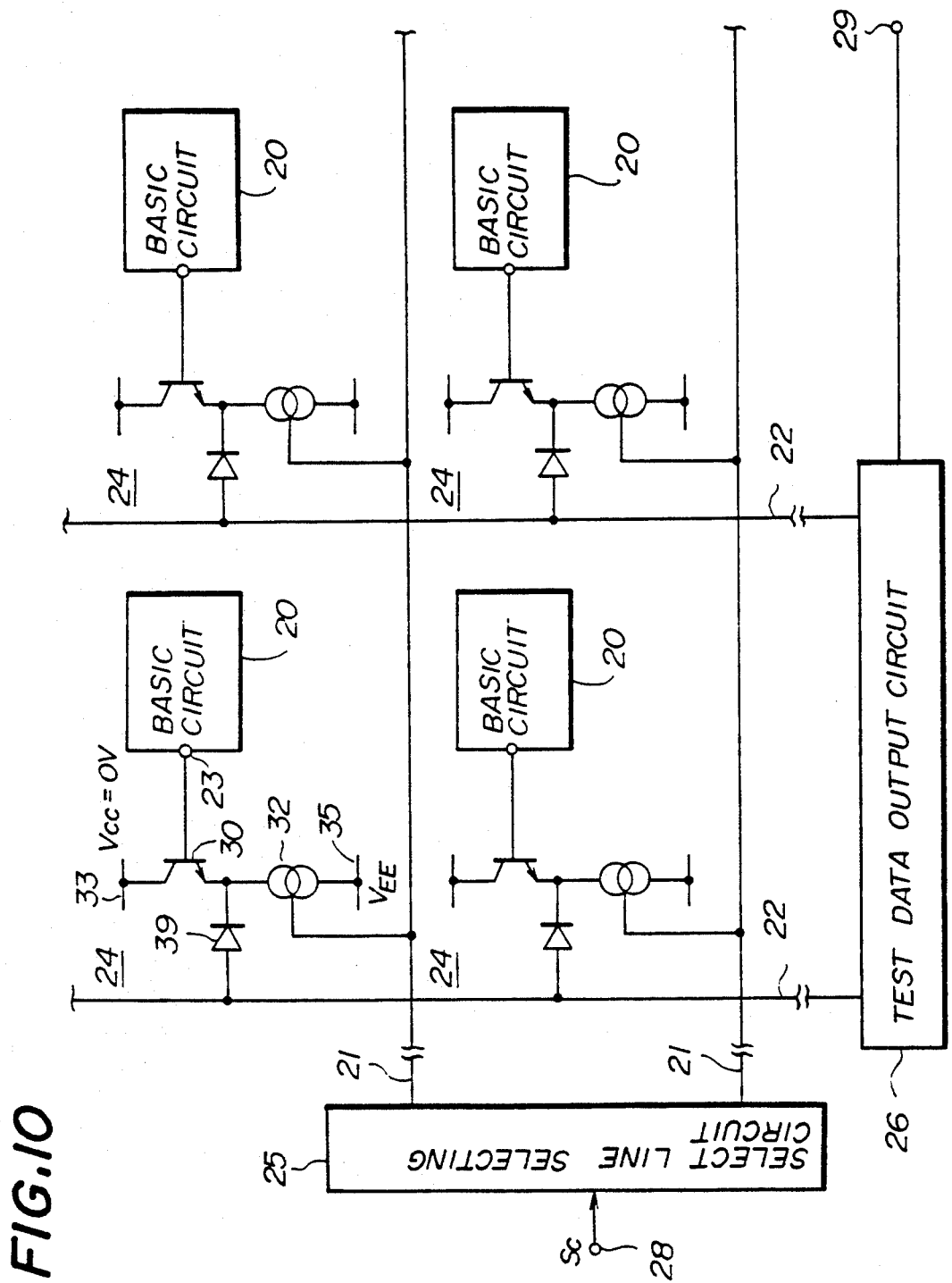
FIG. 10 is a block diagram illustrating an outline of a third preferred embodiment of the present invention.

A description will now be given of a semiconductor integrated circuit device according to a third preferred embodiment of the present invention. FIG. 10 shows an outline of the third preferred embodiment of the present invention.

The switching circuit 24 shown in FIG. 10 has the transistor 30, a diode 39 and the constant-current source 32. The collector of the transistor 30 is connected to the high-voltage power supply line 33, and the base thereof is connected directly to the test point 23 or connected thereto via a resistor (not shown). The emitter of the transistor 30 is connected to the cathode of the diode 39, which has the anode connected to the corresponding read line 22. The constant-current source 32 is connected between the emitter of the transistor 30 and the low-voltage power supply line 35. The ON and OFF states of the constant-current source 32 are controlled via the corresponding select line 21.

When the switching circuit 24 is ON, the transistor 30 is maintained in the active state irrespective of the logical state of the test point 23. For example, when the logical state of the test point 23 is at a high level, for example $V_{OH}$ (a high logic level), the emitter voltage of the transistor 30, that is, the cathode voltage of the diode 39 is equal to $(V_{OH} - V_{BE})$. As a result, the anode voltage of the diode 39, that is, the voltage of the read line 22 becomes equal to $V_{OH}$. On the other hand, when the logical state of the test point 23 is maintained at a low level, for example $V_{OL}$ (a low logic level), the emitter voltage of the transistor 30, that is, the cathode voltage of the diode 39 is equal to $(V_{OL} - V_{BE})$. Thus, the anode voltage of the diode 39, that is, the voltage of the read line 22 becomes equal to $V_{OL}$. It should be noted that according the third embodiment of the present invention, it becomes possible to detect not only the high and low levels of the test point 23 but also the voltage status thereof.

Figure 11:
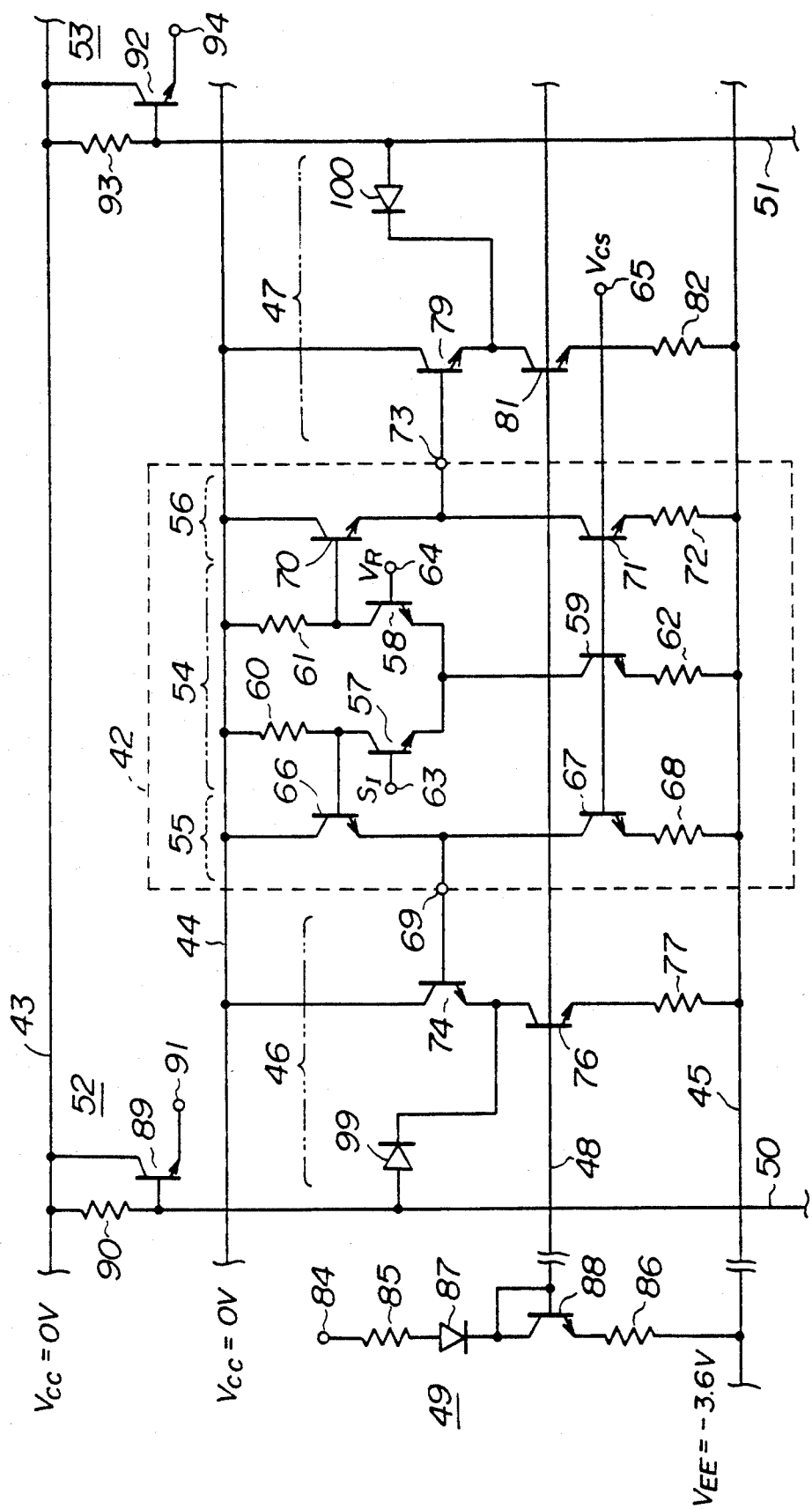
FIG. 11 is a circuit diagram of the third preferred embodiment of the present invention shown in FIG. 10.

FIG. 11 illustrates the configuration shown in FIG. 10 in more detail. The circuit shown in FIG. 11 differs from that shown in FIG. 6A in the structures of the switching circuits 46 and 47. The switching circuit 46 shown in FIG. 11 has the NPN transistors 74 and 76, the resistor 77 and a diode 99. The diode 99 is substituted for the NPN transistor 75 shown in FIG. 6A. The collector of the NPN transistor 74 is connected to the high-voltage power supply line 44, and the base thereof is connected to the logic signal output terminal 69. The emitter of the NPN transistor 74 is connected to the cathode of the diode 99 and the collector of the NPN transistor 76. The anode of the diode 99 is connected to the corresponding read line 50.

The switching circuit 47 has two NPN transistors 79 and 81, the resistor 82 and a diode 100. The NPN transistor 80 shown in FIG. 6A is replaced by the diode 100. The collector of the NPN transistor 79 is connected to the high-voltage power supply line 44, and the base thereof is connected to the logic signal output terminal 73. The emitter of the NPN transistor 79 is connected to the cathode of the diode 100 and the collector of the NPN transistor 81. The anode of the diode 100 is connected to the corresponding read line 51. The other parts shown in FIG. 11 are the same as those shown in FIG. 6A.

During operation, when the NPN transistor 76 is turned ON, a current defined by the following formula passes through a current path comprising the NPN transistor 76 and the resistor 77:

$(V_{SEL-ON} - V_{BE} - V_{EE})/R77.$

When the logic signal output terminal 69 is at the high level, for example, $V_{OH}$, the emitter voltage of the NPN transistor 74, that is, the cathode voltage of the diode 99 is equal to $(V_{OH} - V_{BE})$. Thus, the anode voltage of the diode 99, that is, the voltage of the read line 50 becomes equal to $V_{OH}$, so that a voltage, $(V_{OH} - V_{BE})$ can be obtained at the data output terminal 91. On the other hand, when the logic signal output terminal 69 is at the low level, for example, $V_{OL}$, the emitter voltage of the NPN transistor 74, that is, the cathode voltage of the diode 99 becomes equal to $(V_{OL} - V_{BE})$. Thus, the anode voltage of the diode 99, that is, the voltage of the read line 50 becomes equal to $V_{OL}$, so that a voltage $(V_{OL} - V_{BE})$ can be obtained at the data output terminal 91.

When the NPN transistor 81 of the switching circuit 47 is ON, a current defined by the following passes through a current path having the NPN transistor 81 and the resistor 82:

$(V_{SEL-ON} - V_{BE} - V_{EE})/R82.$

When the logic signal output terminal 73 is at the high level, for example, $V_{OH}$, the emitter voltage of the NPN transistor 79, that is, the cathode voltage of the diode 100 becomes equal to $(V_{OH} - V_{BE})$. Thus, the anode voltage of the diode 100, that is, the voltage of the read line 51 becomes equal to $V_{OH}$, so that a voltage $(V_{OH} - V_{BE})$ can be obtained at the data output terminal 94. On the other hand, when the logic signal output terminal 73 is at the low level, for example, $V_{OL}$, the emitter voltage of the NPN transistor 79, that is, the cathode voltage of the diode 100 becomes equal to $(V_{OL} - V_{BE})$. Thus, the anode voltage of the diode 100, that is, the voltage of the read line 51 becomes equal to $V_{OL}$, so that a voltage $(V_{OL} - V_{BE})$ can be obtained at the data output terminal 94.

Thus, it becomes possible to determine whether or not the ECL basic circuit 42 is normally operating on the basis of the readout voltages of the data output terminals 91 and 94. It should be noted that it is possible to not only determine whether each of the logic signal output terminals 69 and 73 is at the high or low level but also detect the voltage status thereof. It will be seen that the circuit shown in FIG. 11 is simpler than that shown in FIG. 6A.

A description will now be given of a fourth preferred embodiment of the present invention with reference to FIG. 12. The fourth embodiment of the present invention corresponds to a combination of the aforementioned second and third embodiments of the present invention.

Figure 12:
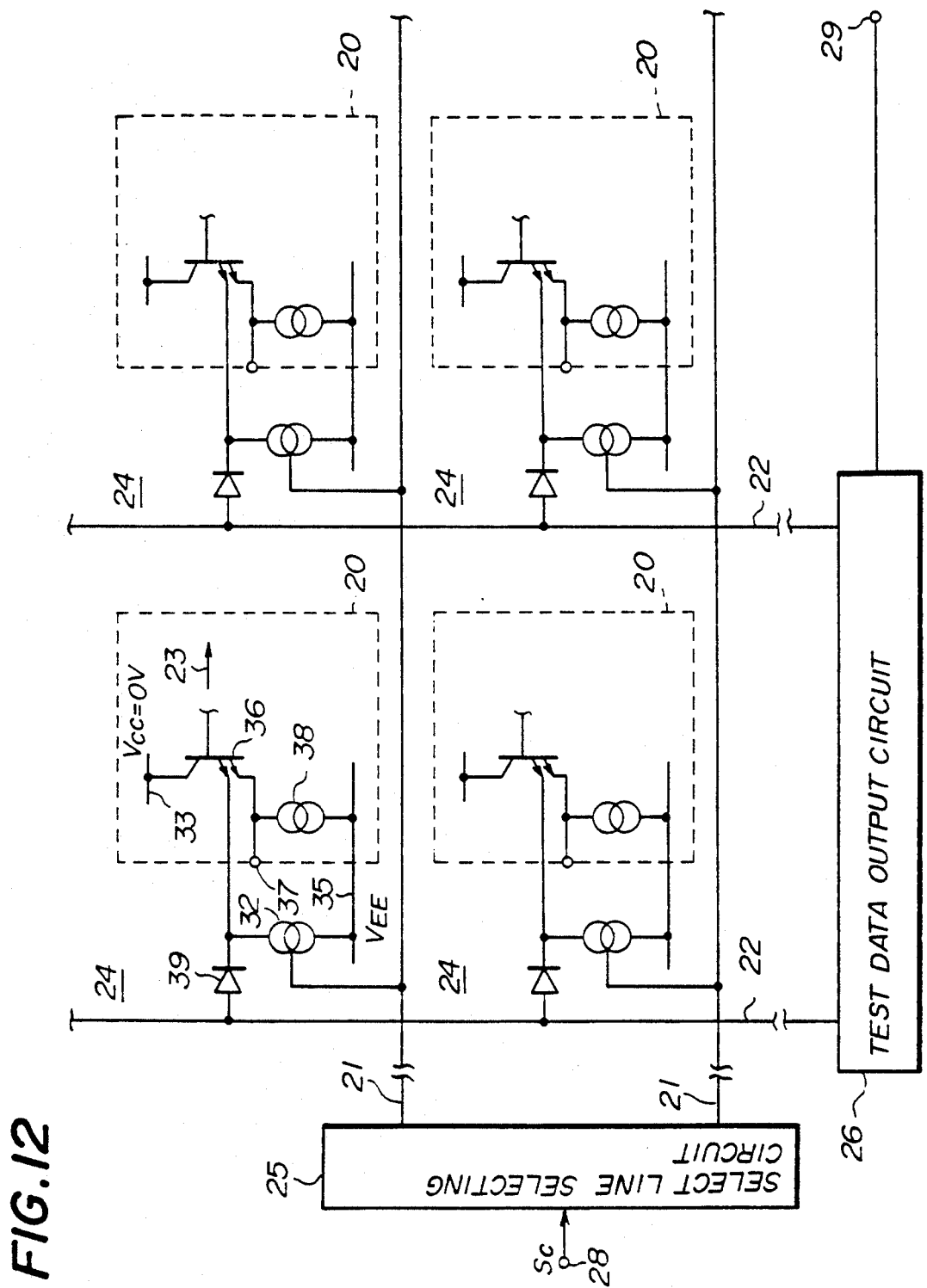
FIG. 12 is a block diagram illustrating an outline of a fourth preferred embodiment of the present invention.

Referring to FIG. 12, the switching circuit 24 has the aforementioned multi-emitter type NPN transistor 36 having the first and second emitters provided in the basic circuit 20, and the diode 39 and the constant-current source 32. It will be noted that the diode 39 and the constant-current source 32 are provided outside of the basic circuit 20. The collector of the transistor 36 is connected to the high-voltage power supply line 33, and the base thereof is connected to the test point 23 in the basic circuit 20. The anode of the diode 39 is connected to the corresponding read line 22, and the cathode thereof is connected to the first emitter of the transistor 36. The constant-current source 32 is connected between the first emitter of the transistor 36 and the low-voltage power supply line 35. The ON and OFF states of the constant-current source 32 are controlled via the corresponding select line 21.

When the switching circuit 24 is turned ON, a transistor part consisting of the collector, base and the first emitter of the transistor 36 is maintained in the active state irrespective of the logical state of the test point 23. For example, then the logical state of the test point 23 is high, for example, $V_{OH}$, the first emitter voltage of the transistor 36, that is, the cathode voltage of the diode 39 becomes equal to $(V_{OH} - V_{BE})$. Thus, the anode voltage of the diode 39, that is, the voltage of the read line 22 becomes equal to $V_{OH}$. On the other hand, when the logical state of the test point 23 is low, for example $V_{OL}$, the emitter voltage of the transistor 36, that is, the cathode voltage of the diode 39 becomes equal to $(V_{OL} - V_{BE})$. Thus, the anode voltage of the diode 39, that is, the voltage of the read line 22 becomes equal to $V_{OL}$. It will be noted that the circuit shown in FIG. 12 is capable of detecting not only the high and low levels of the test point 23 but also the voltage thereof itself.

Figure 13:
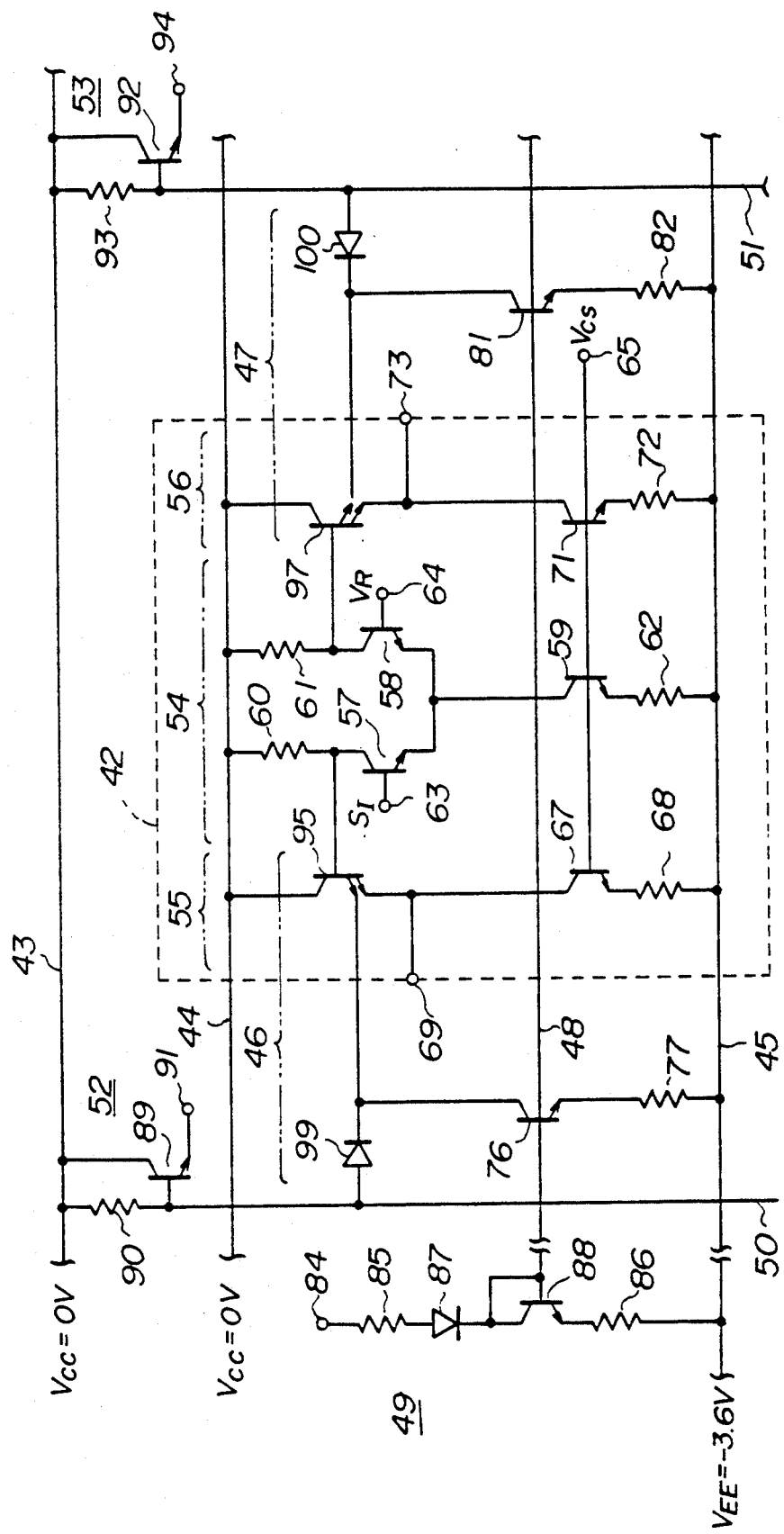
FIG. 13 is a circuit diagram of the fourth preferred embodiment of the present invention.

FIG. 13 illustrates the configuration shown in FIG. 12 in more detail. The configuration shown in FIG. 13 differs from that shown in FIG. 11 in the structures of the emitter follower circuits 55 and 56 of the ECL basic circuit 42 and the switching circuits 46 and 47. The emitter follower circuit 55 has the aforementioned multi-emitter type NPN transistor 95 having the first and second emitters, the NPN transistor 67 and the resistor 68. The collector of the NPN transistor 95 is connected to the high-voltage power supply line 44, and the base thereof is connected to the collector of the NPN transistor 57 (test point). The second emitter of the NPN transistor 95 is connected to the logic signal output terminal 69 and the collector of the NPN transistor 67. The other parts of the emitter follower circuit 55 are the same as those of the emitter follower circuit 55 shown in FIG. 11.

The emitter follower circuit 56 has the aforementioned multi-emitter type NPN transistor 97 having the first and second emitters, the NPN transistor 71 and the resistor 72. The collector of the NPN transistor 97 is connected to the high-voltage power supply line 44, and the base thereof is connected to the collector of the NPN transistor 58. The second emitter of the NPN transistor 97 is connected to the logic signal output terminal 73 and the collector of the NPN transistor 71. The other parts of the emitter follower circuit 56 are the same as those of the emitter follower circuit 56 shown in FIG. 11.

The switching circuit 46 shown in FIG. 13 has the aforementioned NPN transistor 95, the diode 99, the NPN transistor 76 and the resistor 77. The anode of the diode 99 is connected to the read line 50, and the cathode thereof is connected to the first emitter of the NPN transistor 95 and the collector of the NPN transistor 76. The other parts of the switching circuit 46 are the same as those of the switching circuit 46 shown in FIG. 11.

The switching circuit 47 shown in FIG. 13 has the aforementioned NPN transistor 97, the diode 100, the NPN transistor 81 and the resistor 82. The anode of the diode 100 is connected to the read line 51, and the cathode thereof is connected to the first emitter of the NPN transistor 97 and the collector of the NPN transistor 81. The other parts of the switching circuit 47 shown in FIG. 13 are the same as those of the switching circuit 47 shown in FIG. 11.

When the NPN transistor 76 of the switching circuit 46 is turned ON, a current defined by the following passes through a current path comprises of the NPN transistor 76 and the resistor 77:

$(V_{SEL-ON} - V_{BE} - V_{EE})/R77.$

When collector voltage of the NPN transistor 57 is high, for example, $V_{OH}$, the voltage of the first emitter of the NPN transistor 95, that is, the cathode voltage of the diode 99 becomes equal to $(V_{OH} - V_{BE})$. Thus, the anode voltage of the diode 99, that is, the voltage of the read line 50 becomes equal to $V_{OH}$, so that a voltage $(V_{OH} - V_{BE})$ can be obtained at the data output terminal 91. On the other hand, when the collector voltage of the NPN transistor 57 is low, for example, $V_{OL}$, the voltage of the first emitter of the NPN transistor 95, that is, the cathode voltage of the diode 99 becomes equal to $(V_{OL} - V_{BE})$. Thus, the anode voltage of the diode 99, that is, the voltage of the read line 50 becomes equal to $V_{OL}$, so that a voltage $(V_{OL} - V_{BE})$ can be obtained at the data output terminal 91.

The NPN transistor 81 of the switching circuit 47 is turned ON, a current defined by the following passes through a current path including the NPN transistor 81 and the resistor 82:

$(V_{SEL-ON} - V_{BE} - V_{EE})/R82.$

When the collector voltage of the NPN transistor 58 is high, for example, equal to $V_{OH}$, the voltage of the first emitter of the NPN transistor 97, that is, the cathode voltage of the diode 100 becomes equal to $(V_{OH} - V_{BE})$. Thus, the anode voltage of the diode 100, that is, the voltage of the read line 51 becomes equal to $V_{OH}$, so that a voltage $(V_{OH} - V_{BE})$ can be obtained at the data output terminal 94. On the other hand, when the collector voltage of the NPN transistor 58 is low, for example, equal to $V_{OL}$, the emitter voltage of the first emitter of the NPN transistor 97, that is, the cathode voltage of the diode 100 becomes equal to $(V_{OL} - V_{BE})$, so that a voltage $(V_{OL} - V_{BE})$ can be obtained at the data output terminal 94. With the above-mentioned arrangement, it becomes possible to determine whether or not the ECL basic circuit 42 is normally operating on the basis of the readout voltages of the data output terminals 91 and 94. It is also possible to determine whether each of the collector voltages of the NPN transistors 57 and 58 is high or low and to detect the voltage value itself. It will be seen that the configuration shown in FIG. 13 is simpler than that shown in FIG. 11.

A description will now be given of a semiconductor integrated circuit device according to a fifth preferred embodiment of the present invention. FIG. 14 illustrates an outline of the fifth embodiment of the present invention. The switching circuit 24 has at least the transistor 30. The collector of the transistor 30 is connected to the corresponding read line 22, and the base thereof is connected to the test point 23 via a resistor 40. Alternatively, it is also possible to directly connect the base of the transistor 30 to the test point 23. The emitter of the transistor 30 is coupled to the corresponding read line 21 via a resistor 41. Alternatively, it is also possible to directly connect the emitter of the transistor 30 to the corresponding select line 21.

When the switching circuit 24 is turned ON and the logical state of the test point 23 is the high level, a (large) current passes through the collector of the transistor 30 via the the test data output circuit 26 and the read line 22. On the other hand, when the switching circuit 24 is turned ON and the logical state of the test point 23 is the low level, a (small) current passes through the collector of the transistor 30 via the the test data output circuit 26 and the read line 22. In this case, it is also possible to turn OFF the transistor 30.

Figure 15A:
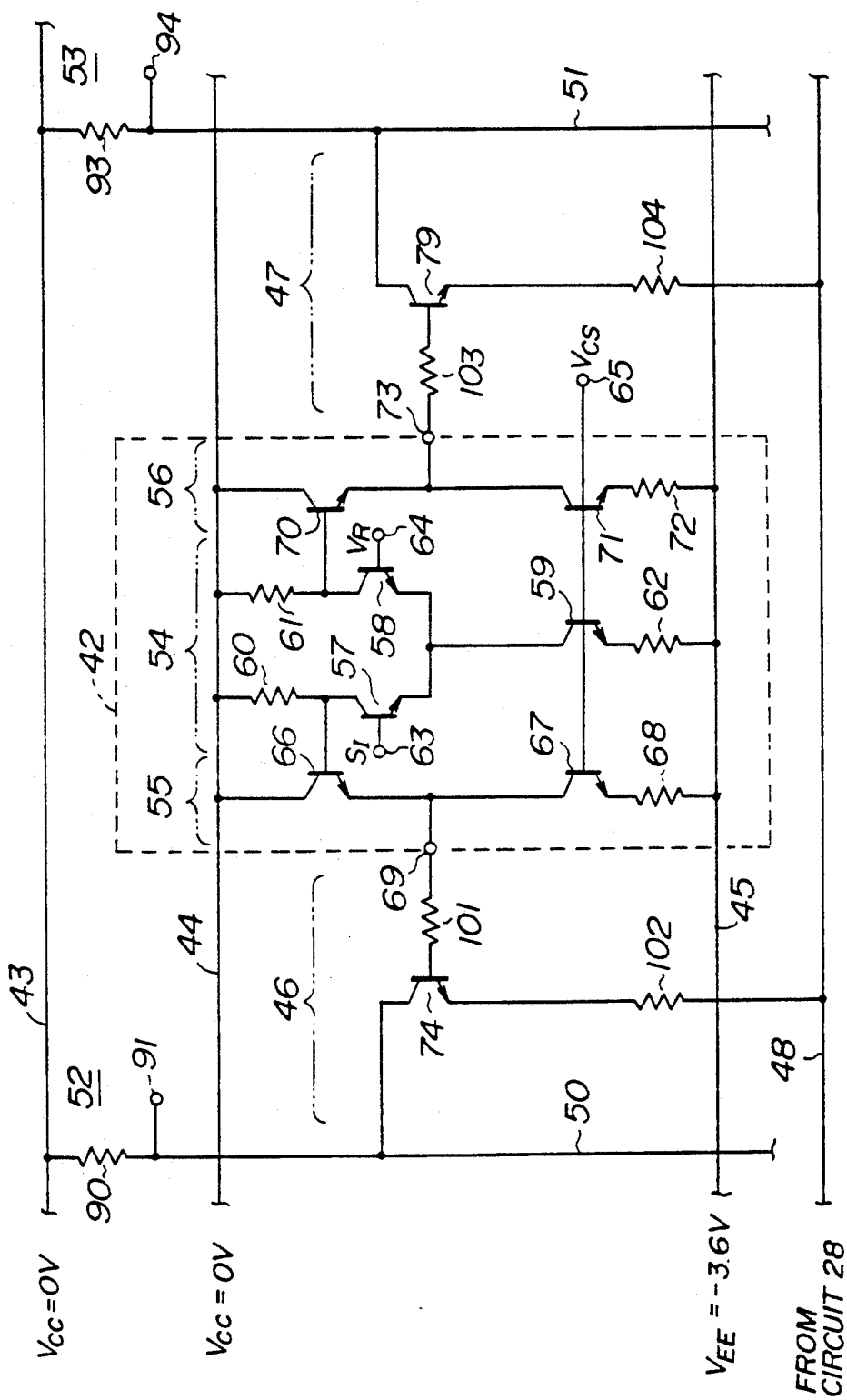
FIG. 15A is a circuit diagram of the fifth preferred embodiment of the present invention shown in FIG. 14.

FIG. 15A illustrates a first configuration based on the concept shown in FIG. 14. The circuit shown in FIG. 15A differs from that shown in FIG. 6A in the structures of the switching circuits 46 and 47 and the read line current detection circuits 52 and 53. The switching circuit 46 has the NPN transistor 74, and two resistors 101 and 102. The collector of the NPN transistor 74 is connected to the corresponding read line 50, and the base thereof is coupled to the logic signal output terminal 69 via the resistor 101. The emitter of the NPN transistor 74 is connected to the select line 48 via the resistor 102. The resistor 101 functions to reduce a load applied to the ECL basic circuit 42 (an emitter-base capacitance $C_{EB}$ of the NPN transistor 74, and a collector-base capacitance $C_{CB}$ thereof, for example). The resistor 102 functions to determine current passing through the NPN transistor 74.

The switching circuit 47 has the NPN transistor 79 and two resistors 103 and 104. The collector of the NPN transistor 79 is connected to the corresponding read line 51, and the base thereof is connected to the logic signal output terminal 73 via the resistor 103. The emitter of the transistor 79 is connected to the corresponding select line 48 via the resistor 104. The resistor 103 functions to reduce a load applied to the ECL basic circuit 42 (an emitter-base capacitance $C_{EB}$ of the NPN transistor 79, and a collector-base capacitance $C_{CB}$ thereof, for example). The resistor 104 functions to determine current passing through the NPN transistor 79.

The voltage of the select line 48, V48, is determined so that $V48 > (V_{OH} - V_{BE})$ when the select line 48 is not being selected, where $V_{OH}$ and $V_{OL}$ are respectively logically high and low voltages of each of the logic signal output terminals 69 and 73. On the other hand, when the select line 48 is being selected, the voltage V48 of the select line 48 is determined so that $(V_{OL} - V_{BE} < V48 < (V_{OH} - V_{BE}))$.

Figure 15B:
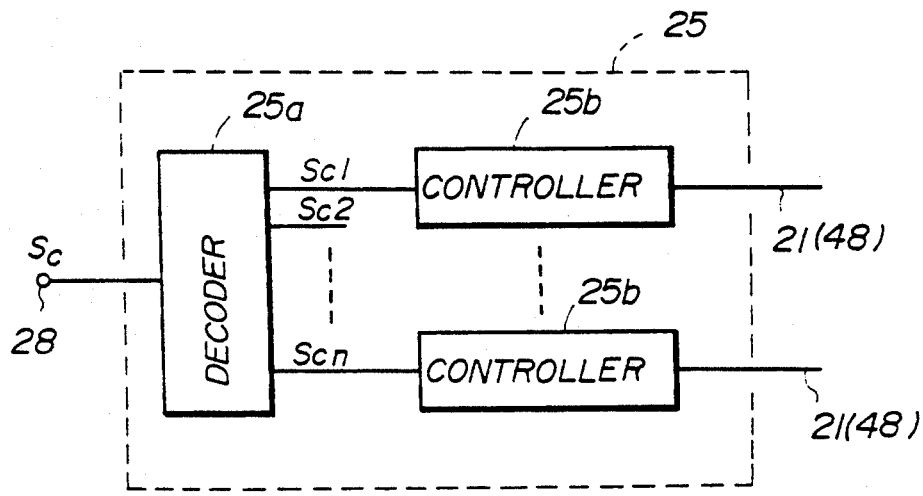
FIG. 15B is a block diagram of a select line select circuit shown in FIG. 14.

As shown in FIG. 15B, the select line select circuit 25 shown in FIG. 14 has a decoder (counter) 25a, and a plurality of select line controllers 25b. The decoder 25a receives the select signal (clock signal) Sc from an external device and outputs decoded select signals Sc1, Sc2, ..., Scn where n is an integer. Each of the select line controllers 25b controls the corresponding select line 21 (48), as described above.

Figure 15C:
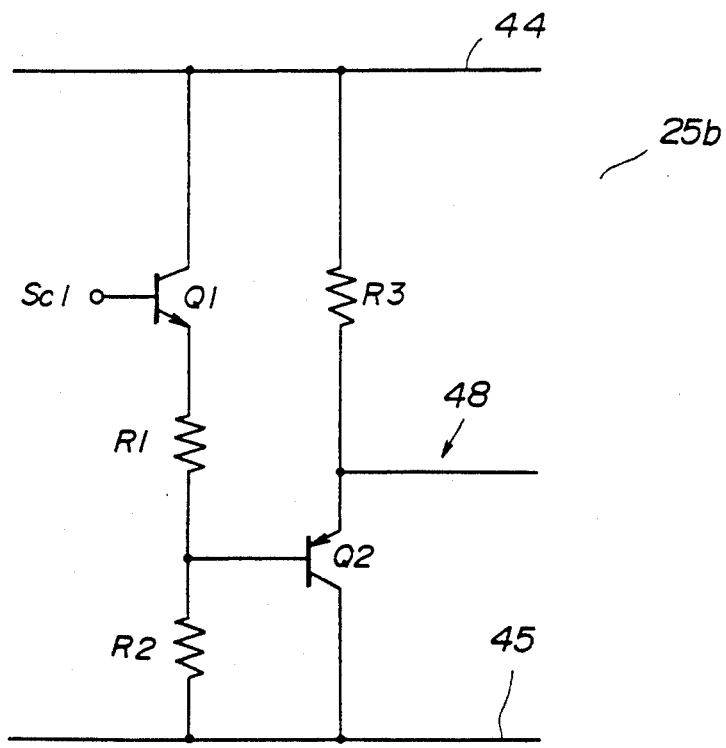
FIG. 15C is a circuit diagram of each controller shown in FIG. 15B.

FIG. 15C is a circuit diagram of each of the select line controllers 25b. As shown, each select line controller 25b has an NPN transistor Q1, a PNP transistor Q2, and three resistors R1, R2 and R3. The collector of the NPN transistor Q1 is connected to the high-voltage power supply line 44, and the emitter thereof is coupled to the low-voltage power supply line 45 via the resistors R1 and R2 connected in series. The base of the NPN transistor Q1 receives the decoded select signal Sc1 having either an ECL high level $V_{IH}$ or an ECL low level $V_{IL}$. When the decoded select signal Sc1 having the high level $V_{IH}$ is applied to the base of the NPN transistor Q1, the corresponding select line 48 is selected. In response to the high level $V_{IH}$, the NPN transistor Q1 turns ON, so that a voltage obtained by dividing the voltage difference between the lines 44 and 45 by a resistor network consisting of the resistors R1 and R2 is applied to the base of the PNP transistor Q2.

More specifically, when $V_{IH}$ is applied to the base of the NPN transistor Q1, the voltage V48 of the select line 48 is as follows:

$$V48 = V_{IH} - V_{BE} - R1I1 + V_{BE}$$
$$= V_{IH} - R1I1$$

where $V_{BE}$ (first occurrence) is the emitter-base voltage of the NPN transistor Q1, $V_{BE}$ (second occurrence) is the emitter-base voltage of the PNP transistor Q2, R1 is the resistance of the resistor R1, and I1 is a current passing through the resistor R2 and defined by the following:

$$I1 = (V_{EE} - V_{IH} - V_{BE})/(R1 + R2).$$

On the other hand, $V_{IL}$ is applied to the base of the NPN transistor Q1, the voltage V48 of the select line 48 is as follows:

$$V48 = V_{IL} - V_{BE} - R1I1 + V_{BE}$$
$$= V_{IL} - R1I1$$

where $V_{BE}$ (first occurrence) is the emitter-base voltage of the NPN transistor Q1 $V_{BE}$ (second occurrence) is the emitter-base voltage of the PNP transistor Q2, and I1 is a current passing through the resistor R2 and defined by the following:

$$I1 = (V_{EE} - V_{IL} - V_{BE})/(R1 + R2).$$

Assuming that $V_{IH} = -0.8$ [V], $V_{IL} = -1.6$[V], R1=[2kΩ, R2=6 [kΩ], R3=8 [kΩ], $V_{BE}$ of the NPN transistor Q1 is 0.8[V], and $V_{BE}$ of the PNP transistor Q2 is 0.8[V], V48 = −1.3[V] when the select line 48 is not selected, and V48 = −1.9[V] when the select line 48 is selected.

Turning now to FIG. 15A, when the logic signal output terminal 69 of the switching circuit 46 is at the high level, the NPN transistor 74 is in the active state. Thus, a current defined by the following passes through the read line 50:

$$(V_{OH} - V_{BE} - V48)/R102$$

where R102 is the resistance of the resistor 102. As a result, the voltage of the data output terminal 91 is as follows:

$$[(V_{OH} - V_{BE} - V48)/R102] R90.$$

On the other hand, when the logic signal output terminal 69 is at the low level, the NPN transistor 74 is OFF. Thus, no current passes through the read line 50. That is, the voltage of the data output terminal 91 is zero volt.

When the logic signal output terminal 73 related to the switching circuit 47 is at the high level, the NPN transistor 79 is in the active state. Thus, a current defined by the following passes through the read line 51:

$$(V_{OH} - V_{BE} - V48)/R104$$

where R104 is the resistance of the resistor 104. As a result, the voltage of the data output terminal 94 is as follows:

$$[(V_{OH} - V_{BE} - V48)/R104] R93.$$

On the other hand the logic signal output terminal 73 is at the low level, the NPN transistor 79 is OFF. Thus, no current passes through the read line 51. That is, the voltage of the data output terminal 94 is zero volt. Thus, it is possible to determine whether or not the ECL basic circuit 42 is normally operating on the basis of the read-out voltages of the data output terminals 91 and 94.

Figure 16:
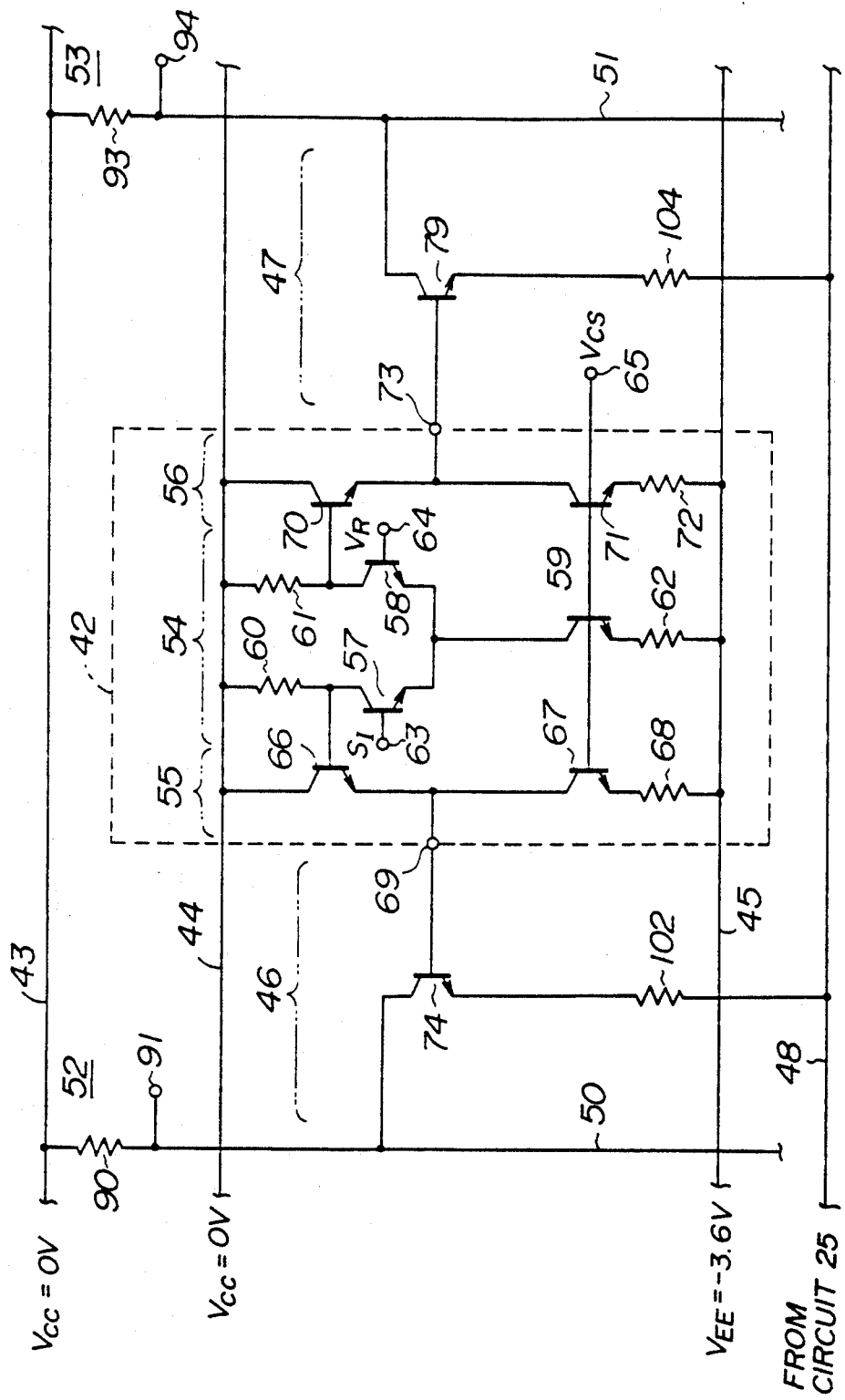
FIG. 16 is a circuit diagram of a variation of the circuit shown in FIG. 15A.

FIG. 16 illustrates a second variation based on the configuration shown in FIG. 14. The second variation shown in FIG. 16 differs from the circuit shown in FIG. 15A in the structures of the switching circuits 46 and 47. That is, the switching circuit 46 shown in FIG. 16 has the NPN transistor 74 and the resistor 102. The base of the NPN transistor 74 is directly connected to the logic signal output terminal 69. The switching circuit 47 has the NPN transistor 79 and the resistor 104. The base of the NPN transistor 79 is directly connected to the logic signal output terminal 73. The other parts shown in FIG. 16 are the same as those shown in FIG. 15A. The operation of the circuit shown in FIG. 16 is the same as that of the circuit shown in FIG. 15A.

Figure 17:
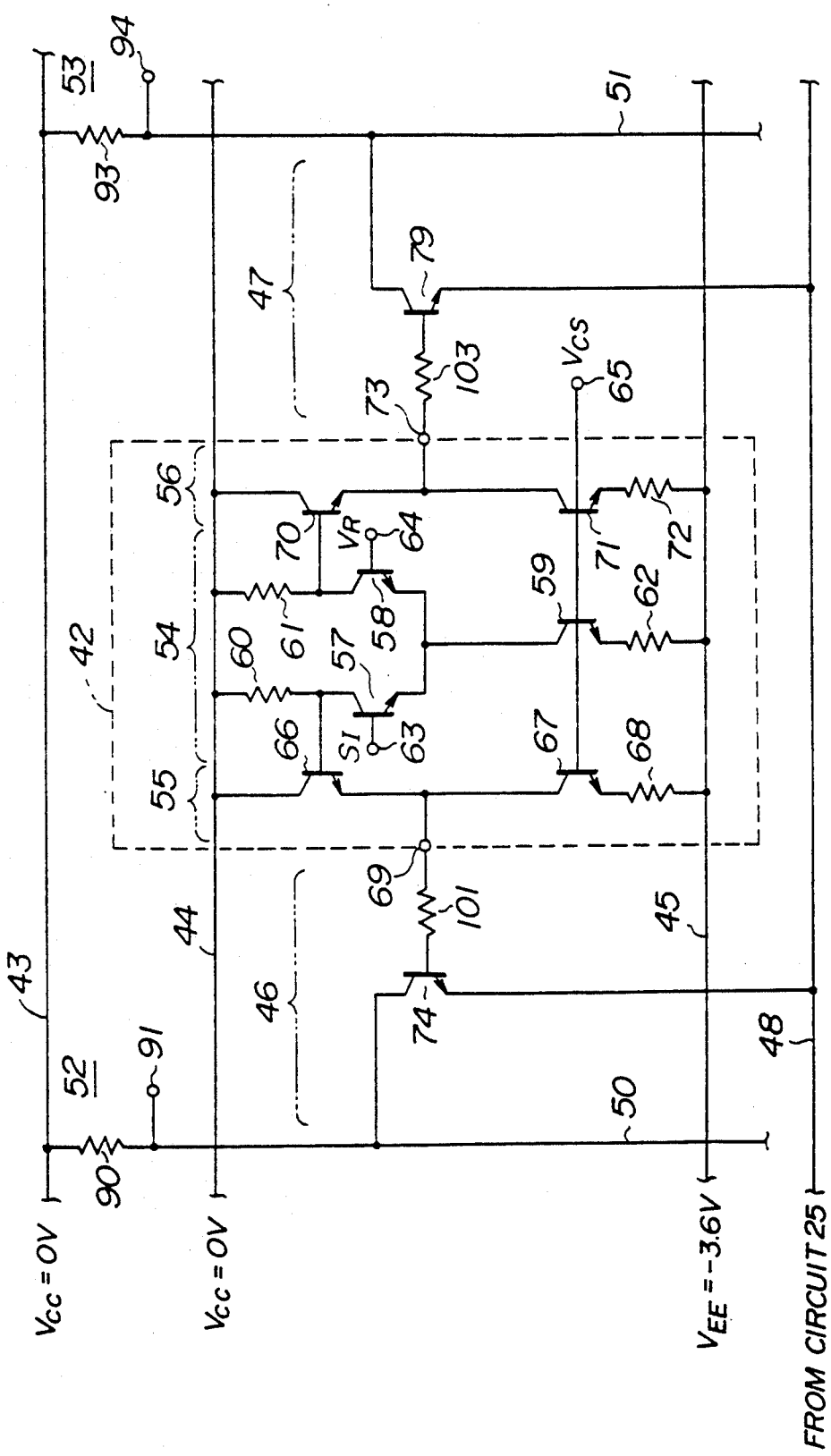
FIG. 17 is a circuit diagram of another variation of the circuit shown in FIG. 15A.

FIG. 17 illustrates a third variation based on the configuration shown in FIG. 14. The third variation shown in FIG. 17 differs from the circuit shown in FIG. 15A in the structures of the switching circuits 46 and 47. The switching circuit 46 of the third variation has the NPN transistor 74 and the resistor 101. The emitter of the NPN transistor 74 is directly connected to the select line 48. Similarly, the switching circuit 47 of the third variation has the NPN transistor 79 and the resistor 103. The emitter of the NPN transistor 79 is directly connected to the select line 48. The other parts shown in FIG. 17 are the same as those shown in FIG. 15A. The operation of the circuit shown in FIG. 17 is the same as that of the circuit shown in FIG. 15A.

Figure 18A:
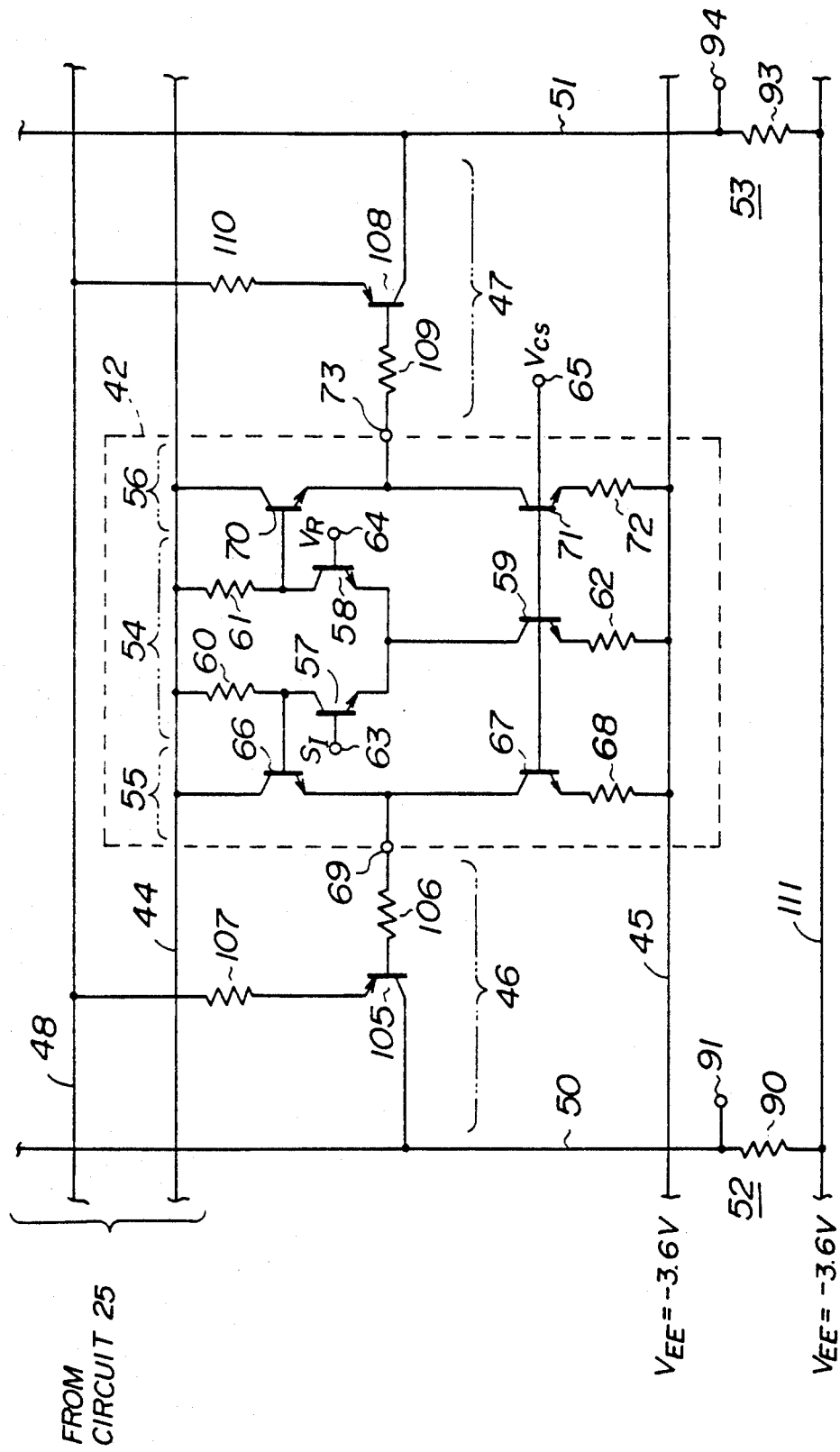
FIG. 18A is a circuit diagram of a sixth preferred embodiment of the present invention.

Referring to FIG. 18A, a description will now be given of a sixth preferred embodiment of the present invention, which is based on the concept shown in FIG. 14. The fourth variation shown in FIG. 18A differs from the circuit shown in FIG. 15A in the structures of the switching circuits 46 and 47 and the read line current detection circuits 52 and 53. The switching circuit 46 is composed of a PNP transistor 105, and two resistors 106 and 107. The collector of the PNP transistor 105 is connected to the read line 50, and the base thereof is connected to the logic signal output terminal 69 via the resistor 106. The emitter of the PNP transistor 105 is coupled to the select line 48 via the resistor 107.

The switching circuit 47 is composed of a PNP transistor 108, and two resistors 109 and 110. The collector of the PNP transistor 108 is connected to the read line 51, and the base thereof is connected to the logic signal output terminal 73 via the resistor 109. The emitter of the PNP transistor 108 is connected to the select line 48 via the resistor 110. The read line current detection circuit 52 has the resistor 90. The read line 50 is connected to a low-voltage power supply line 111 via the resistor 90. Similarly, the read line current detection circuit 53 has the resistor 93. The read line 51 is connected to the low-voltage power supply line 111 via the resistor 93. The circuit shown in FIG. 18A operates in the same way as that shown in FIG. 15A except that the current detection related to the read lines 50 and 51 is carried out with respect to $V_{EE}$ in place of ground and thus the polarity is reversed.

Figure 18B:
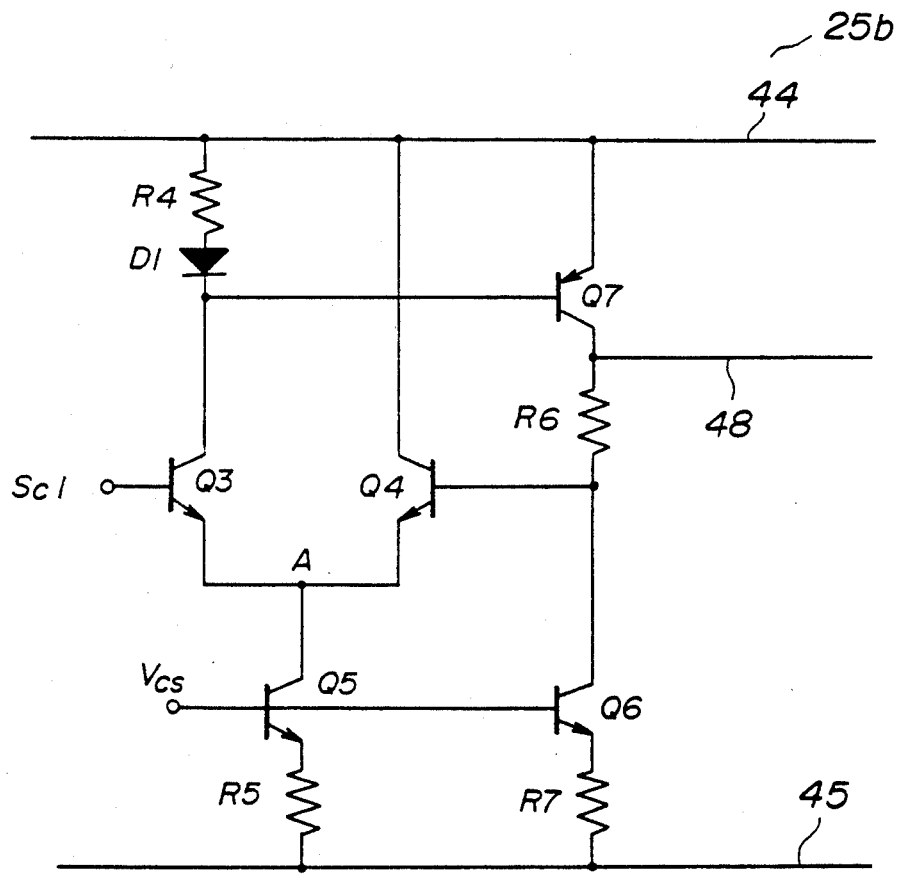
FIG. 18B is a circuit diagram of each controller provided in a select line select circuit used in the sixth embodiment of the present invention.

Each select line 48 is controlled so that $V48 < (-V_{OL} + V_{BE})$ when it is not selected, and $V48 > (V_{OL} + V_{BE})$ when it is selected. The above-mentioned control is carried out by the select line select control 25 shown in FIG. 15B in which each controller 25b is formed, as shown in FIG. 18B. Each controller 25b has NPN transistor Q3, Q4, Q5 and Q6, and a PNP transistor Q7, resistors R4, R5, R6 and R7, and a diode D1. A series circuit consisting of the resistor R4 and the diode D1 is connected between the high-voltage power supply line 44 and the collector of the NPN transistor Q3. The decoded select signal Sc1 is applied to the base of the NPN transistor Q3. The collector of the NPN transistor Q4 is directly connected to the high-voltage power supply line 44. The emitters of the NPN transistors Q3 and Q4 are connected to the collector of the NPN transistor Q5. The emitter of the NPN transistor Q5 is coupled to the low-voltage power supply line 45 via the resistor R5. The NPN transistor Q5 and the resistor R5 form a constant-current source. The base of the PNP transistor Q7 is connected to the collector of the NPN transistor Q3, and the emitter of the PNP transistor Q7 is connected to the high-voltage power supply line 44. The collector of the PNP transistor Q7 is connected to the select line 48, and connected to the base of the NPN transistor Q4 and the collector of the NPN transistor Q6 via the resistor R6. The emitter of the NPN transistor Q6 is coupled to the low-voltage power supply line 45 via the resistor R7. The NPN transistor Q6 and the resistor R7 form a constant-current source. A reference voltage Vcs is applied to the bases of the NPN transistors Q5 and Q6.

When the base potential of the NPN transistor Q4 becomes lower than that of the NPN transistor Q3, a current passing through the NPN transistor Q4 decreases, and a current passing through the NPN transistor Q3 increases. Thus, the current passing through the resistor R4 and the diode D1 increases, so that the base-emitter voltage $V_{BE}$ of the PNP transistor Q7 increases and an increased amount of current passes through the PNP transistor Q7. As a result, the potential of the select line 48 is increased. An increase in the potential of the select line 48 increases the base potential of the NPN transistor Q3 through the resistor R6, so that the base potentials of the NPN transistors Q3 and Q4 are balanced.

On the other hand, when the base potential of the NPN transistor Q4 becomes higher than that of the NPN transistor Q3, the current passing through the NPN transistor Q4 increases, and the current passing through the NPN transistor Q3 decreases. Thus, the current passing through the resistor R4 and the diode D1 is decreased, so that the base-emitter voltage $V_{BE}$ of the PNP transistor Q7 decreases, and thus the current passing through the PNP transistor Q7 decreases. As a result, the potential V48 of the select line 48 decreases. A decrease in the potential of the select line 48 decreases the base potential of the NPN transistor Q4 through the resistor R6, so that the base potentials of the NPN transistors Q3 and Q4 are balanced.

In the above-mentioned way, the circuit shown in FIG. 18B operates so that the base potentials of the NPN transistors Q3 and Q4 are always balanced. Thus, the potential V48 of the select line 48 is set to be higher than the base potential of the NPN transistor Q4 by a voltage drop developed across the resistor R6.

The select line 48 is determined on the basis of the potential (level) of the decoded select signal Sc1. Assuming that $V_{OH} = -0.8[V]$, $V_{OL} = -1.6[V]$, $Vcs = -2.4[V]$, and $V_{EE} = -3.6[V]$, the collector current of each of the NPN transistors Q5 and Q6 is approximately 0.2 [mA], if $V_{BE} \approx 0.8[V]$, and R2 = R4 = 2 [kΩ]. Thus, the potential V48 of the select line 48 is 0.4[V] (= 2kΩ × 0.2 mA) higher than the potential of the base of the NPN transistor Q3. Thus, when the level of the decoded select signal Sc1 is equal to $V_{OH}$ (= −0.8[V]), the potential V48 is approximately −0.4[V]. On the other hand, when the level of the decoded select signal Sc1 is equal to $V_{OL}$ (= −1.6[V]), the potential V48 is approximately equal to −1.2[V]. Assuming that a load current passing through the select line 48 fluctuates between 0 and a few mA, the resistance value of the resistor R4 is between 0.5 and 1 [kΩ].

Figure 19:
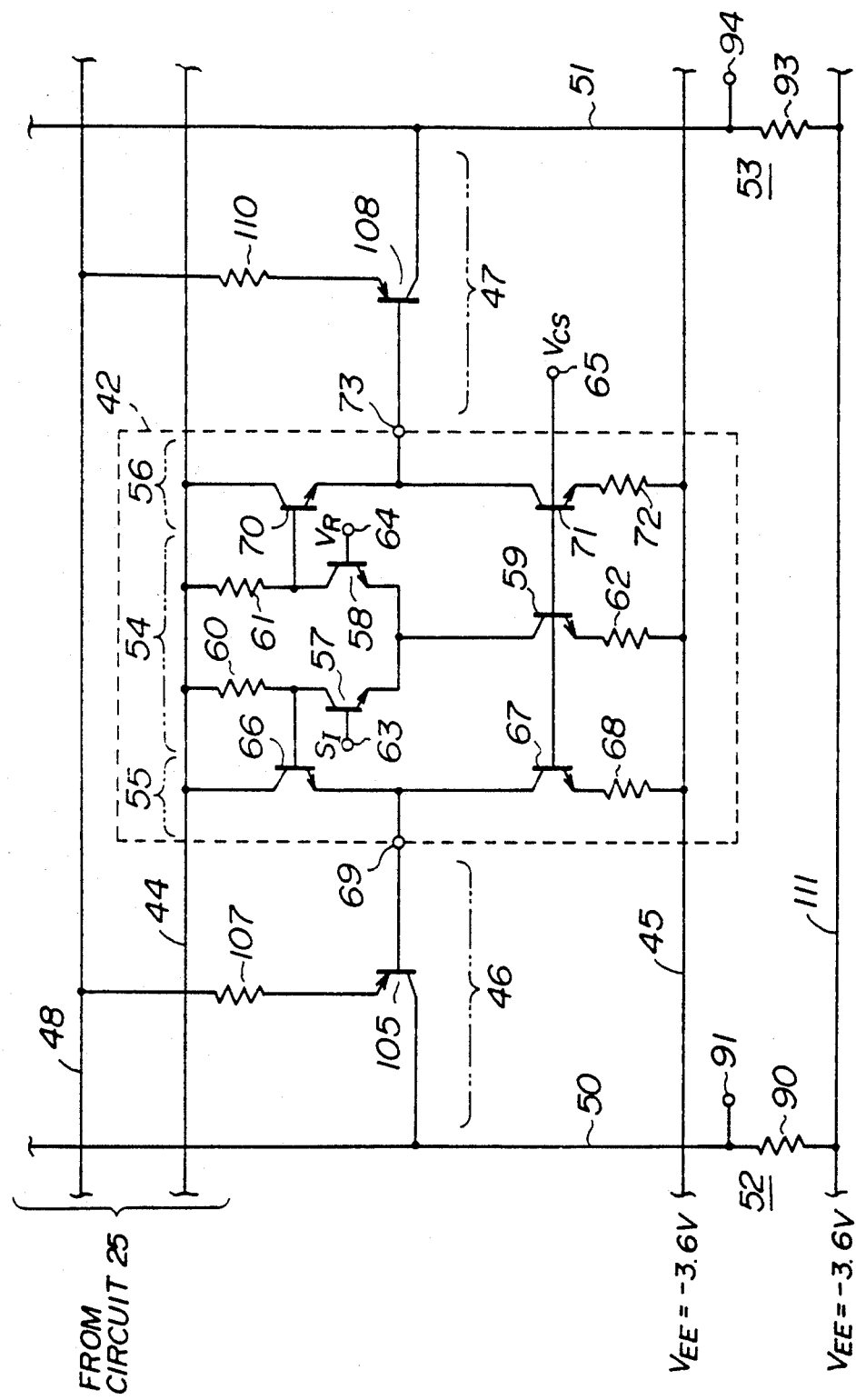
FIG. 19 is a circuit diagram illustrating a variation of the circuit shown in FIG. 18A.

FIG. 19 is a first variation of the circuit shown in FIG. 18A. The first variation shown in FIG. 19 differs from the configuration shown in FIG. 18A in the structures of the switching circuits 46 and 47. The switching circuit 46 shown in FIG. 19 does not use the resistor 106 shown in FIG. 18A. That is, the base of the PNP transistor 105 is directly connected to the logic signal output terminal 69. The switching circuit 47 shown in FIG. 19 does not use the resistor 109 shown in FIG. 18A. That is, the base of the PNP transistor 108 is directly connected to the logic signal output terminal 73. The other parts shown in FIG. 19 are the same as those shown in FIG. 18A.

Figure 20:
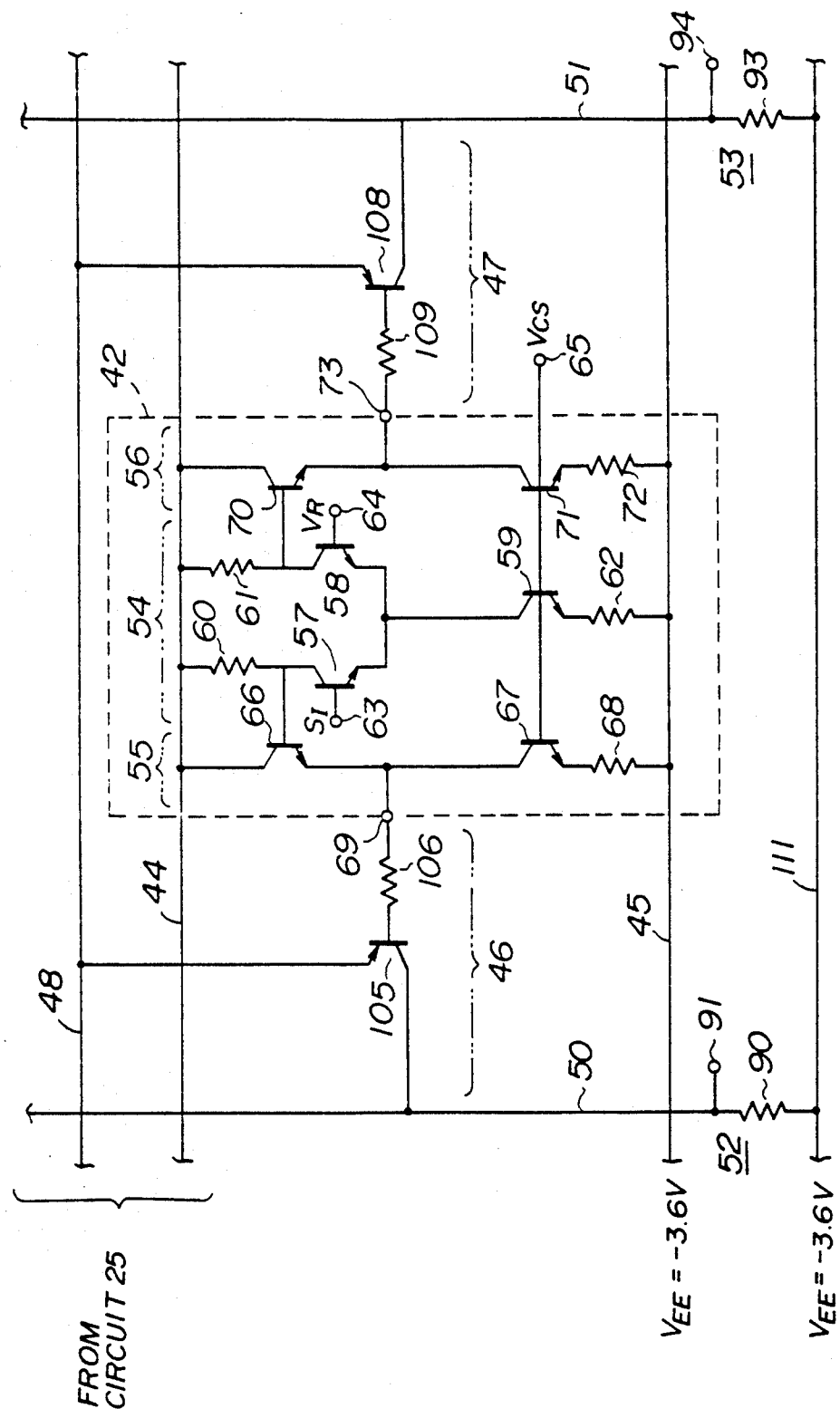
FIG. 20 is a circuit diagram illustrating another variation of the circuit shown in FIG. 18A.

FIG. 20 is a circuit diagram of a second variation of the configuration shown in FIG. 18A. The second variation differs from the configuration shown in FIG. 18A in the structures of the switching circuits 46 and 47. The switching circuit 46 shown in FIG. 20 does not use the resistor 107 shown in FIG. 18A. That is, the emitter of the PNP transistor 105 is directly connected to the select line 48. The switching circuit 47 shown in FIG. 20 does not use the resistor 110 shown in FIG. 18A. That is, the emitter of the PNP transistor 108 is directly connected to the select line 48. The other parts shown in FIG. 20 are the same as those shown in FIG. 18A.

The present invention is not limited to the specifically disclosed embodiments, and variations and modifications may be made without departing from the scope of the present invention. For example, in the configurations shown in FIGS. 6A, 6B, 7 and 11, it is possible to connect the bases of the NPN transistors 74 and 79 to the logic signal input terminals 69 and 73 via respective resistors. In this case, the loads of the ECL basic circuit 42 can be reduced. However, parasitic capacitances coupled to the above resistors must be less than the input capacitances of the NPN transistors 74 and 79.

The select lines 21 run in parallel with the rows of the basic circuits 20, and the read lines 22 run in parallel with the columns of the basic circuits 20. Alternatively, the select lines 21 may run in parallel with the columns of the basic circuits 20, and the read lines 22 may run in parallel with the rows of the basic circuits 20. It is also possible to arrange the select lines 21 and the read lines so that they obliquely cross each other. It is not necessary to use a fixed distance between the adjacent select lines 21 and a fixed distance between the adjacent read lines 22. The present invention includes CML basic circuits, NTL basic circuits and EFL basic circuits.

What is claimed is:

1. A semiconductor integrated circuit device comprising:
    an array of a plurality of basic circuits respectively comprising emitter coupled logic circuits having corresponding test points and each operative to perform a logic function and to produce output information at the corresponding test point; and
    a test circuit which selectively tests said basic circuits and comprises:
        a plurality of select lines oriented in parallel, spaced relationship and extending in a first direction,
        a plurality of read lines oriented in parallel, spaced relationship and extending in a second direction and defining, with said plurality of select lines, a plurality of intersections respectively corresponding to the plurality of basic circuits;
        a plurality of switching circuits respectively associated with said plurality of basic circuits and said plurality of respectively corresponding intersections, each of said switching circuits being connected between the select line and the read line defining the respectively corresponding intersection and comprising a first bipolar transistor having a base, a collector and an emitter, the base thereof being coupled to the corresponding test point of the respectively associated basic circuit, and each said switching circuit being selectively operative, when said first bipolar transistor thereof is turned ON, for connecting the corresponding test point to the respectively corresponding read line and producing a change in a predetermined parameter of the corresponding read line in accordance with the output information of the corresponding test point,
        selection means for selecting one of said plurality of select lines for outputting a select signal to the selected one of said select lines for turning ON the respective first bipolar transistors of said switching circuits connected to said selected one of said select lines and thereby to produce a change in the predetermined parameter of each read line in accordance with the output information at the corresponding test point, and
        means, connected to each of said plurality of read lines, for detecting a change in the predetermined parameter of each of said plurality of read lines and for producing a respective test data output indicating the output information of the corresponding test point.

2. A semiconductor integrated circuit device as claimed in claim 1, wherein the base of each of said first bipolar transistors is directly connected to said corresponding test point.

3. A semiconductor integrated circuit device as claimed in claim 1, wherein said test circuit further comprises a plurality of resistors respectively associated with said plurality of switching circuits, each resistor being connected between the base of said first bipolar transistor of said respectively associated switching circuit and said corresponding test point.

4. A semiconductor integrated circuit device as claimed in claim 1, wherein:
    at least a first of said switching circuits further comprises a second bipolar transistor and a constant-current source;
    the collector of said first bipolar transistor of said first switching circuit is connectable to receive a first D.C. voltage;
    said second bipolar transistor of said first switching circuit comprises a collector connected to said corresponding one of said read lines, a base connectable to receive a reference voltage, and an emitter; and
    said constant-current source of said first switching circuit is coupled to the respective emitters of said first and second bipolar transistors and is connectable to receive a second D.C. voltage and said constant-current source thereof further has a control terminal coupled to a corresponding one of said select lines, and is controlled by said select signal between ON and OFF states respectively corresponding to the ON and OFF states of said corresponding one of the switching circuits.

5. A semiconductor integrated circuit device as claimed in claim 1, wherein:
    at least a first of said switching circuits further comprises a second bipolar transistor and a constant-current source;

the collector of said first bipolar transistor of said first switching circuit is connected to said corresponding one of said read lines;

said second bipolar transistor of said first switching circuit comprises a collector connectable to receive a first D.C. voltage, a base connectable to receive a reference voltage, and an emitter; and said constant-current source of said first switching circuit is coupled to the emitters of said first and second bipolar transistors and is connectable to receive a second D.C. voltage and said constant-current source thereof further has a control terminal coupled to a corresponding one of said select lines, and is controlled by said select signal between ON and OFF states corresponding to the ON and OFF states of said corresponding one of the switching circuits.

6. A semiconductor integrated circuit device as claimed in claim 1, wherein:

at least one of said switching circuits further comprises a diode having an anode, connected to said corresponding one of said read lines, a cathode connected to the emitter of said first bipolar transistor, and a constant-current source;

the collector of said first bipolar transistor of said first switching circuit is connectable to receive a first D.C. voltage;

said constant-current source of said first switching circuit is coupled to the emitters of said first and second bipolar transistors and is connectable to receive a second D.C. voltage, and said constant-current source thereof further has a control terminal coupled to a corresponding one of said select lines, and is controlled by said select signal between ON and OFF states corresponding to the ON and OFF states of said corresponding one of the switching circuits.

7. A semiconductor integrated circuit device as claimed in claim 1, wherein:

at least a first of said switching circuits comprises a first resistor and a second resistor;

the base of said first bipolar transistor of said switching circuit is coupled to said corresponding test point through said first resistor;

the emitter of said first bipolar transistor of said first switching circuit is coupled to said corresponding one of said select lines through said second resistor; and the collector of said first bipolar transistor of said and first switching circuit is connected to said corresponding one of said read lines.

8. A semiconductor integrated circuit device as claimed in claim 7, wherein:

said first bipolar transistor of said first switching circuit is an NPN bipolar transistor;

said test circuit further comprises control means for maintaining each of said select lines at a first potential, lower than a predetermined level, when each of said select lines is selected and for maintaining each of said select lines at a second potential, higher than said predetermined level, when each of said select lines is not selected; and said first potential corresponds to said select signal.

9. A semiconductor integrated circuit device as claimed in claim 7, wherein:

said first bipolar transistor of said first switching circuit is a PNP bipolar transistor;

said test circuit further comprises control means for maintaining each of said select lines at a first potential, higher than a predetermined level, when each of said select lines is selected and for maintaining each of said select lines at a second potential, lower than said predetermined level, when each of said select lines is not selected; and said first potential corresponds to said select signal.

10. A semiconductor integrated circuit device as claimed in claim 8, wherein said predetermined potential level corresponds to a voltage obtained by subtracting the base-emitter voltage of said first bipolar transistor of said first switching circuit from a high logic voltage level obtained at said corresponding test point.

11. A semiconductor integrated circuit device as claimed in claim 9, wherein said predetermined potential level corresponds to a voltage obtained by adding the base-emitter voltage of said first bipolar transistor of said first switching circuit to a low logic voltage level obtained at said corresponding test point.

12. A semiconductor integrated circuit device as claimed in claim 8, wherein said control means further comprises a plurality controllers respectively associated with the plurality of select lines, and wherein each of said controllers comprises:

third, fourth and fifth resistors;

a corresponding, said second bipolar transistor having a collector connectable to receive a first D.C. voltage, a base connectable to receive a signal indicating the corresponding said select signal, and an emitter connectable to receive a second D.C. voltage via said third and fourth resistors connected in series; and a third bipolar transistor having an emitter connectable to receive said first D.C. voltage through said fifth resistor and connected to said corresponding one of said select lines, a base connected to a connection node between said third and fourth resistors, and a collector connectable to receive said second D.C. voltage.

13. A semiconductor integrated circuit device as claimed in claim 9, wherein said control means further comprises a plurality of controllers respectively associated with the plurality of select lines, and wherein each of said controllers comprises:

third and fourth resistors;

a diode;

first and second current sources;

a corresponding, said second bipolar transistor having a collector connectable to receive a first D.C. voltage via said third resistor and said diode connected in series, a base connectable to receive a signal indicating the corresponding said select signal, and an emitter connected to said first current source, the latter being connectable to receive a second D.C. voltage; and a third bipolar transistor having a collector connectable to said first D.C. voltage, an emitter connected to said first current source, and a base; and a fourth bipolar transistor having a base connected to the collector of said second bipolar transistor, an emitter connectable to receive said first D.C. voltage, and a collector coupled to the base of said third bipolar transistor through said fourth resistor and connected to said corresponding one of said select lines, the collector of said fourth bipolar transistor being connected to said second constant-current source, the latter being connectable to receive said second D.C. voltage.

14. A semiconductor integrated circuit device as claimed in claim 1, wherein at least a first of said switching circuits further comprises:
a first resistor;
the base of said first bipolar transistor being directly connected to said corresponding test point;
the emitter of said first bipolar transistor being coupled to said corresponding one of said select lines through said first resistor; and
the collector of said first bipolar transistor being connected to said corresponding read line.

15. A semiconductor integrated circuit device as claimed in claim 14, wherein:
said first bipolar transistor is an NPN type bipolar transistor;
said test circuit further comprises control means for maintaining each of said select lines at a first potential lower than a predetermined level when each of said select lines is selected and for maintaining each of said select lines at a second potential higher than said predetermined level when each of said select lines is not selected; and
said first potential corresponds to said select signal.

16. A semiconductor integrated circuit device as claimed in claim 14, wherein:
said first bipolar transistor of said first switching circuit is a PNP bipolar transistor;
said test circuit further comprises control means for maintaining each of said select lines at a first potential higher than a predetermined level when each of said select lines is selected and for maintaining each of said select lines at a second potential lower than said predetermined level when each of said select lines is not selected; and
said first potential corresponds to said select signal.

17. A semiconductor integrated circuit device as claimed in claim 15, wherein said predetermined potential level corresponds to a obtained by subtracting the base-emitter voltage of said first bipolar transistor of said first switching circuit from a high logic voltage level obtained at said corresponding test point.

18. A semiconductor integrated circuit device as claimed in claim 16, wherein said predetermined potential level corresponds to a voltage obtained by adding the base-emitter voltage of said first bipolar transistor of said first switching circuit to a low logic voltage level obtained at said corresponding test point.

19. A semiconductor integrated circuit device as claimed in claim 15, wherein said control means further comprises a plurality of controllers respectively associated with the plurality of select lines, and wherein each of said controllers comprises:
second, third and fourth resistors;
a corresponding, said second bipolar transistor having a collector connectable to receive a first D.C. voltage, a base connectable to receive a signal indicating the corresponding said select signal, and an emitter connectable to receive a second D.C. voltage via said second and third resistors connected in series; and
a third bipolar transistor having an emitter connectable to receive said first D.C. voltage through said fourth resistor and connected to said corresponding one of said select lines, a base connected to a connection node between said second and third resistors, and a collector connectable to receive said second D.C. voltage.

20. A semiconductor integrated circuit device as claimed in claim 16, wherein said control means further comprises a plurality of controllers respectively associated with the plurality of select lines, and wherein each of said controllers comprises:
second and third resistors;
a diode;
first and second current sources;
a corresponding, said second bipolar transistor having a collector connectable to receive a first D.C. voltage via said second resistor and said diode connected in series, a base connectable to receive a signal indicating the corresponding said select signal, and an emitter connected to said first current source, the latter connectable to receive said second D.C. voltage;
a third bipolar transistor having a collector connectable to said first D.C. voltage, an emitter connected to said first current source, and a base; and
a fourth bipolar transistor having a base connected to the collector of said second bipolar transistor, an emitter connectable to receive said first D.C. voltage, and a collector coupled to the base of said third bipolar transistor through said third resistor and connected to said corresponding select line, the collector of said fourth bipolar transistor being connected to said second constant-current source, the latter connectable to receive said second D.C. voltage.

21. A semiconductor integrated circuit device as claimed in claim 1, wherein:
at least a first of said switching circuits further comprises a first resistor;
the base of said first bipolar transistor being coupled to said test point through said first resistor;
the emitter of said first bipolar transistor being connected to said corresponding select line; and
the collector of said first bipolar transistor being connected to said corresponding read line.

22. A semiconductor integrated circuit device as claimed in claim 21, wherein:
said first bipolar transistor of said first switching circuit is an NPN type bipolar transistor;
said test circuit further comprises control means for maintaining each of said select lines at a first potential lower than a predetermined level when each of said select lines is selected and for maintaining each of said select lines at a second potential higher than said predetermined level when each of said select lines is not selected; and
said first potential corresponds to said select signal.

23. A semiconductor integrated circuit device as claimed in claim 21, wherein:
said first bipolar transistor of said first switching circuit is a PNP bipolar transistor;
said test circuit comprises control means for maintaining each of said select lines at a first potential higher than a predetermined level when each of said select lines is selected and for maintaining each of said select lines at a second potential lower than said predetermined level when each of said select lines is not selected; and
said first potential corresponds to said select signal.

24. A semiconductor integrated circuit device as claimed in claim 22, wherein said predetermined potential level corresponds to a voltage obtained by subtracting the base-emitter voltage of said first bipolar transistor of said switching circuit from a high logic voltage level obtained at said corresponding test point.

25. A semiconductor integrated circuit device as claimed in claim 23, wherein said predetermined potential level corresponds to a voltage obtained by adding the base-emitter voltage of said first bipolar transistor of said switching circuit to a low logic voltage level obtained at said corresponding test point.

26. A semiconductor integrated circuit device as claimed in claim 22, wherein said control means further comprises a plurality of controllers respectively associated with the plurality of select lines, and wherein each of said controllers comprises:
   second, third and fourth resistors;
   a corresponding, said second bipolar transistor having a collector connectable to receive a first D.C. voltage, a base connectable to receive a signal indicating the corresponding said select signal, and an emitter connectable to receive a second D.C. voltage via said second and third resistors connected in series; and
   a third bipolar transistor having an emitter connectable to receive said first D.C. voltage through said fourth resistor and connected to said corresponding one of said select lines, a base connected to a connection node between said second and third resistors, and a collector connectable to receive said second D.C. voltage.

27. A semiconductor integrated circuit device as claimed in claim 23, wherein said control means further comprises a plurality of controllers respectively associated with the plurality of select lines, and wherein each of said controllers comprises:
   second and third resistors;
   a diode;
   first and second current source;
   a corresponding, said second bipolar transistor having a collector connectable to receive a first D.C. voltage via said second resistor and said diode connected in series, a base connectable to receive a signal indicating the corresponding said select signal, and an emitter connected to said first current source, the latter connectable to receive said second D.C. voltage;
   a third bipolar transistor having a collector connectable to said first D.C. voltage, an emitter connected to said first current source, and a base;
   a fourth bipolar transistor having a base connected to the collector of said second bipolar transistor, an emitter connectable to receive said first D.C. voltage, and a collector coupled to the base of said third bipolar transistor through said third resistor and connected to said corresponding select line, the collector of said fourth bipolar transistor being connected to said second constant-current source, the latter connectable to receive said second D.C. voltage.

28. A semiconductor integrated circuit device as claimed in claim 1, wherein said change in said predetermined parameter is a change in the voltage of each of said read lines.

29. A semiconductor integrated circuit device as claimed in claim 1, wherein said change in said predetermined parameter is a change in the level of a current passing through each of said read lines.

30. A semiconductor integrated circuit device as claimed in claim 1, wherein each of said test points is electrically coupled to the output terminal of said corresponding emitter coupled logic circuit.

31. A semiconductor integrated circuit device as claimed in claim 1, wherein said test data output means comprises, for each of read read lines:
   a second bipolar transistor and a resistor;
   said second bipolar transistor having a base connected to said respectively corresponding read line, a collector connectable to receive a predetermined D.C. voltage, and an emitter comprising an output terminal at which said test data output is produced; and
   said resistor having a first end connected to the base of said second bipolar transistor, and a second end connectable to receive said predetermined D.C. voltage.

32. A semiconductor integrated circuit device as claimed in claim 1, wherein:
   said test data output means comprises, for each of said read lines:
   a resistor having a first end connected to said corresponding one of said read lines and a second end connectable to receive a predetermined D.C. voltage; and
   said first end of said resistor comprising an output terminal at which said test data output is produced.

33. A semiconductor integrated circuit device as claimed in claim 1, wherein each of said plurality of basic circuits has two of said switching circuits respectively associated therewith and coupling the test point thereof to two respective read lines.

34. A semiconductor integrated circuit device as claimed in claim 1, further comprising a respective emitter follower circuit connected between each of said emitter coupled logic circuits of said basic circuits and said respectively associated switching circuits.

35. A semiconductor integrated circuit device comprising:
   an array of a plurality of basic circuits respectively comprising emitter coupled logic circuits having corresponding test points and each operative to perform a logic function and to produce output information at the corresponding test point; and
   a test circuit which selectively tests said basic circuits and comprises:
   a plurality of select lines oriented in parallel, spaced relationship and extending in a first direction,
   a plurality of read lines oriented in parallel, spaced relationship and extending in a second direction and defining, with said plurality of select lines, a plurality of intersections respectively corresponding to the plurality of basic circuits;
   a plurality of switching circuits respectively associated with said plurality of basic circuits and said plurality of respectively corresponding intersections, each of said switching circuits being connected between the select line and the read line defining the respectively corresponding intersection and comprising a first multi emitter bipolar transistor having a base, a collector and first and second emitters, and base thereof being coupled to the corresponding test point of the respectively associated basic circuit and the second emitter functioning as an output terminal of the emitter coupled logic circuit, and each said switching circuit being selectively operative, when said first multi emitter bipolar transistor thereof is turned ON, for connecting the corresponding test point to the respectively corresponding read line and producing a change in a predetermined parameter of the corresponding read line in accordance with the output information of the corresponding test point, selection means for selecting one of said plurality of select lines and for outputting a select signal to the selected one of said select lines for turning ON the respective first multi emitter bipolar transistors of said switching circuits connected to said selected one of said select lines and thereby to produce a change in the predetermined parameter of each read line in accordance with the output information at the corresponding test point, and means, connected to each of said plurality of read lines, for detecting a change in the predetermined parameter of each of said plurality of read lines and for producing a respective test data output indicating the output information of the corresponding test point.

36. A semiconductor integrated circuit device as claimed in claim 35, wherein:

at least a first of said switching circuits comprises a second bipolar transistor and a constant-current source;

the collector of said first multi-emitter bipolar transistor of said first switching circuit being connectable to receive a first D.C. voltage;

said second bipolar transistor of said first switching circuit having a collector connected to said corresponding read line, a base connectable to receive a reference voltage, and an emitter; and said constant-current source of said first switching circuit is coupled to the emitters of said first and second bipolar transistors and further is connectable to receive a second D.C. voltage and said constant-current source thereof further has a control terminal coupled to said corresponding select line, and is controlled by said select signal between ON and OFF states respectively corresponding to the ON and OFF states of said corresponding switching circuit.

37. A semiconductor integrated circuit device as claimed in claim 35, wherein at least a first of said switching circuits further comprises:

a diode having an anode connected to said corresponding read line and a cathode connected to said first emitter of said first multi-emitter bipolar transistor, the latter having the collector thereof connectable to receive a first D.C. voltage; and a constant-current source connected to the first emitter of said first multi-emitter bipolar transistor further and connectable to receive a second D.C. voltage.

38. A semiconductor integrated circuit device comprising:

an array of a plurality of basic circuits respectively comprising emitter coupled logic circuits each having corresponding first and second test points and each operative to perform a logic function and to produce respective output information at the corresponding first and second test points; and a test circuit which selectively tests said basic circuits and comprises:

a plurality of select lines oriented in parallel, spaced relationship and extending in a first direction, a plurality of pairs of read lines oriented in parallel, spaced relationship and extending in a second direction and defining, with said plurality of select lines, a plurality of pairs of intersections respectively corresponding to the plurality of basic circuits;

a plurality of pairs of switching circuits respectively associated with said plurality of basic circuits and said plurality of respectively corresponding pairs of intersections, each of said pairs of switching circuits being connected between the select line and the respective pair of read lines defining the respectively corresponding pair of intersections with the respective select line and each comprising a first bipolar transistor having a base, a collector and an emitter, the respective bases of the pair being coupled to the corresponding first and second test points of the respectively associated basic circuit, and each said switching circuit of each pair being selectively operative, when said first bipolar transistor thereof is turned ON, for connecting the corresponding one of the first and second test points to the respectively corresponding pair of read lines and producing a change in a predetermined parameter of the corresponding read line in accordance with the output information of the corresponding first and second test points.

selection means for selecting one of said plurality of select lines and for outputting a select signal to the selected one of said select lines for turning ON the respective first bipolar transistors of said switching circuits connected to said selected one of said select lines and thereby to produce a change in the predetermined parameter of each read line in accordance with the output information at the corresponding test point, and means, connected to each of said plurality of read lines, for detecting a change in the predetermined parameter of each of said plurality of read lines and for producing a respective test data output indicating the output information of the corresponding test point.

39. A semiconductor integrated circuit device as claimed in claim 38, wherein:

each of said emitter coupled logic circuits, has, respective, first and second input terminals and first and second output terminals; and said respective first and second output terminals of each of said emitter coupled logical circuits respectively correspond to said first and second test points of said respective basic circuit.

40. A semiconductor integrated circuit device as claimed in claim 38, wherein the respective bases of said pair of first bipolar transistors are directly connected to said corresponding first and second test points.

41. A semiconductor integrated circuit device as claimed in claim 38, wherein, for each of said pair of bipolar transistors in each of said basic circuits, said test circuit further comprises a corresponding resistor connected between the base of said first bipolar transistor and said corresponding one of said first and second test points.

* * * * *

UNITED STATES PATENT AND TRADEMARK OFFICE
CERTIFICATE OF CORRECTION

PATENT NO. : 5,231,345   Page 1 of 2
DATED : July 27, 1993
INVENTOR(S) : KATAKURA et al.

It is certified that error appears in the above-indentified patent and that said Letters Patent is hereby corrected as shown below:

On title page, [56] References Cited:

Under "FOREIGN PATENT DOCUMENTS", please insert:

0174236   3/1986   European Pat. Off. .
0223714   5/1987   European Pat. Off. .

Under "OTHER PUBLICATIONS", please insert:

Gallia et al., "High-Performance BiCmos 100K-Gate Array," *IEEE Journal of Solid-State Circuits*, Vol. 25, No. 1, Feb. 1990, New York, NY, pages 142-148.

Col. 6,   line 8, change ""OU"" to --"OV"--.

Col. 18,  line 11, after "Q1" insert --,--;
          line 19, change "R1 = [2kΩ," to --R1 = [2kΩ],--;
          line 55, after "hand" insert --, when--.

Col. 20,  line 55, change "$V_{BE} \approx 0.8[V]$" to --$V_{BE} \approx -0.8[V]$--;
          line 65, change "0and" to --0 and--.

Col. 24,  line 23, after "plurality" insert --of--.

UNITED STATES PATENT AND TRADEMARK OFFICE
CERTIFICATE OF CORRECTION

PATENT NO.   :   5,231,345

DATED        :   July 27, 1993

INVENTOR(S)  :   Hiroshi KATAKURA et al.

It is certified that error appears in the above-indentified patent and that said Letters Patent is hereby corrected as shown below:

Col. 25,  line 40, after "to a" insert --voltage--.

Col. 28,  line 5, change "read" (first occurrence) to --said--.

Col. 30,  line 49, after "circuits" delete ",";
          line 53, change "logical" to --logic--.

Signed and Sealed this

Sixth Day of September, 1994

BRUCE LEHMAN

Attest:

Attesting Officer

Commissioner of Patents and Trademarks